US011917876B2

(12) United States Patent
Liu et al.

(10) Patent No.: US 11,917,876 B2
(45) Date of Patent: Feb. 27, 2024

(54) DISPLAY SUBSTRATE AND DISPLAY APPARATUS

(71) Applicants: Chengdu BOE Optoelectronics Technology Co., Ltd., Sichuan (CN); BOE TECHNOLOGY GROUP CO., LTD., Beijing (CN)

(72) Inventors: Cong Liu, Beijing (CN); Hongjun Zhou, Beijing (CN); Lili Du, Beijing (CN); Feng Wei, Beijing (CN)

(73) Assignees: Chengdu BOE Optoelectronics Technology Co., Ltd., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/778,504

(22) PCT Filed: Jun. 21, 2021

(86) PCT No.: PCT/CN2021/101198
§ 371 (c)(1),
(2) Date: May 20, 2022

(87) PCT Pub. No.: WO2022/028132
PCT Pub. Date: Feb. 10, 2022

(65) Prior Publication Data
US 2022/0415998 A1    Dec. 29, 2022

(30) Foreign Application Priority Data

Aug. 7, 2020   (WO) ............... PCT/CN2020/107711

(51) Int. Cl.
*G09G 3/3266*   (2016.01)
*H10K 59/131*   (2023.01)
(Continued)

(52) U.S. Cl.
CPC ........... *H10K 59/131* (2023.02); *G09G 3/006* (2013.01); *G09G 3/3266* (2013.01); *H10K 59/88* (2023.02);
(Continued)

(58) Field of Classification Search
CPC ...... H10K 59/131; H10K 59/88; G09G 3/006; G09G 3/3266; G09G 3/3225;
(Continued)

(56) References Cited

U.S. PATENT DOCUMENTS 8,045,074 B2 * 10/2011 Tanahara .......... G02F 1/136213
349/40
8,355,106 B2 *  1/2013 Jung ................. G02F 1/136209
349/149

(Continued)

FOREIGN PATENT DOCUMENTS

CN      101118329 A    2/2008
CN      101364604 A    2/2009
(Continued)

OTHER PUBLICATIONS

WIPO, International Search Report of PCT/CN2020/107711 dated Apr. 6, 2021.

(Continued)

*Primary Examiner* — Jose R Soto Lopez
(74) *Attorney, Agent, or Firm* — HOUTTEMAN LAW LLC

(57) ABSTRACT

Disclosed is a display substrate, including: a base including a display region and a peripheral region; sub-pixels in the display region; data lines in at least the display region and extending in a first direction and electrically connected to the sub-pixels; gate lines in at least the display region and extending in a second direction intersecting with the first direction, and electrically connected to the sub-pixels; pads (Continued)

in the peripheral region; data leads in the peripheral region and electrically connected to the data lines and the pads; a gate driver circuit in the peripheral region and electrically connected to the gate lines; gate drive lines in the peripheral region and electrically connected to the gate driver circuit; gate leads in the peripheral region and extending in the first direction, which are electrically connected to the gate drive lines and the pads and located between the data leads.

19 Claims, 13 Drawing Sheets

(51) Int. Cl.
    *G09G 3/00*           (2006.01)
    *H10K 59/88*         (2023.01)
    *G09G 3/3225*       (2016.01)

(52) U.S. Cl.
    CPC ... *G09G 3/3225* (2013.01); *G09G 2300/0408* (2013.01); *G09G 2300/0842* (2013.01); *G09G 2300/0861* (2013.01); *G09G 2310/0281* (2013.01); *G09G 2330/04* (2013.01); *G09G 2330/12* (2013.01)

(58) Field of Classification Search
    CPC ... G09G 2300/0408; G09G 2300/0842; G09G 2300/0861; G09G 2310/0281; G09G 2330/04; G09G 2330/12; G09G 3/3233; G09G 2300/0426; G09G 2310/0286; G09G 2310/0297; G02B 27/01; G02F 1/1336; H01L 27/12; H04N 17/00
    See application file for complete search history.

(56) References Cited

U.S. PATENT DOCUMENTS

| | | | |
|---|---|---|---|
| 9,607,581 B2 * | 3/2017 | Park | G09G 5/18 |
| 9,887,256 B2 * | 2/2018 | Kim | H10K 59/121 |
| 9,978,314 B2 * | 5/2018 | Bae | G09G 3/2085 |
| 10,134,825 B2 * | 11/2018 | Shin | G09G 3/3233 |
| 10,304,921 B2 * | 5/2019 | Lee | H10K 59/131 |
| 10,325,559 B2 * | 6/2019 | Lee | G09G 3/20 |
| 10,451,942 B2 * | 10/2019 | Yu | G09G 3/3688 |
| 10,910,458 B2 * | 2/2021 | Matsueda | H10K 50/84 |
| 10,923,056 B2 * | 2/2021 | Sakurai | G02F 1/13452 |
| 10,991,315 B2 * | 4/2021 | Li | G09G 3/3225 |
| 11,132,953 B2 * | 9/2021 | Yamada | H10K 59/131 |
| 11,393,893 B2 * | 7/2022 | Jo | H10K 59/131 |
| 11,508,328 B2 * | 11/2022 | Hur | G09G 3/3677 |
| 2003/0151587 A1 | 8/2003 | Yamashita | |
| 2006/0077191 A1 * | 4/2006 | Ming-Daw | G02F 1/133351 345/204 |
| 2007/0120790 A1 | 5/2007 | Jeon | |
| 2008/0030667 A1 * | 2/2008 | Lee | G02F 1/13452 349/150 |
| 2008/0048934 A1 * | 2/2008 | Yamamoto | G09G 3/3611 345/55 |
| 2008/0266210 A1 * | 10/2008 | Nonaka | G09G 3/20 345/55 |
| 2010/0141570 A1 * | 6/2010 | Horiuchi | G09G 3/3611 345/100 |
| 2011/0018571 A1 | 1/2011 | Kim et al. | |
| 2014/0191930 A1 | 7/2014 | Okumoto | |
| 2014/0240521 A1 * | 8/2014 | Kwak | G09G 3/006 348/189 |
| 2015/0348455 A1 * | 12/2015 | Jeon | G02F 1/134336 345/55 |
| 2016/0043010 A1 | 2/2016 | Kwak et al. | |
| 2016/0054636 A1 * | 2/2016 | Chiang | G02F 1/167 257/774 |
| 2016/0055789 A1 * | 2/2016 | Hashimoto | G09G 3/3648 345/204 |
| 2016/0232837 A1 * | 8/2016 | Lee | G09G 3/3275 |
| 2016/0260367 A1 | 9/2016 | Kwak et al. | |
| 2016/0351093 A1 | 12/2016 | Kim et al. | |
| 2016/0351098 A1 * | 12/2016 | Lin | G02F 1/1345 |
| 2017/0032735 A1 * | 2/2017 | Lee | G09G 3/3225 |
| 2017/0154566 A1 | 6/2017 | Ryoo et al. | |
| 2017/0221434 A1 * | 8/2017 | Shima | G09G 3/3611 |
| 2017/0309644 A1 | 10/2017 | Yeh | |
| 2017/0337859 A1 | 11/2017 | Hirata | |
| 2018/0033354 A1 | 2/2018 | Lee et al. | |
| 2018/0182274 A1 | 6/2018 | Jung et al. | |
| 2019/0027090 A1 * | 1/2019 | Nonaka | G02F 1/13454 |
| 2019/0066595 A1 | 2/2019 | Kim et al. | |
| 2019/0114025 A1 * | 4/2019 | Wei | G06F 3/0448 |
| 2019/0140036 A1 | 5/2019 | Hyeon et al. | |
| 2020/0090566 A1 | 3/2020 | Lee et al. | |
| 2021/0097928 A1 | 4/2021 | Yoon et al. | |
| 2021/0209979 A1 | 7/2021 | Gao et al. | |
| 2021/0247634 A1 | 8/2021 | Chen et al. | |
| 2021/0326000 A1 | 10/2021 | Yang et al. | |
| 2021/0407428 A1 * | 12/2021 | Kang | G09G 3/2092 |
| 2022/0076599 A1 * | 3/2022 | Akyol | G09G 3/3233 |
| 2022/0077273 A1 | 3/2022 | Qing et al. | |
| 2022/0189377 A1 | 6/2022 | Wang et al. | |
| 2022/0328574 A1 | 10/2022 | Jiang et al. | |

FOREIGN PATENT DOCUMENTS

| | | |
|---|---|---|
| CN | 101847638 A | 9/2010 |
| CN | 103530679 A | 1/2014 |
| CN | 104332132 A | 2/2015 |
| CN | 104732908 A | 6/2015 |
| CN | 204516283 U | 7/2015 |
| CN | 104820321 A | 8/2015 |
| CN | 107293567 A | 10/2017 |
| CN | 107957645 A | 4/2018 |
| CN | 108182886 A | 6/2018 |
| CN | 108254984 A | 7/2018 |
| CN | 108803111 A | 11/2018 |
| CN | 109243364 A | 1/2019 |
| CN | 109407321 A | 3/2019 |
| CN | 109491154 A | 3/2019 |
| CN | 109637352 A | 4/2019 |
| CN | 111292660 A | 6/2020 |
| CN | 111430572 A | 7/2020 |

OTHER PUBLICATIONS

USPTO, U.S. Appl. No. 17/296,592 First Office Action, dated Nov. 16, 2023.

* cited by examiner

DISPLAY SUBSTRATE AND DISPLAY APPARATUS

TECHNICAL FIELD

Embodiments of the present disclosure relate to the field of display technology, and in particular relates to a display substrate and a display apparatus.

BACKGROUND

In order to simplify the structure of a driver chip, a detection device, or the like, a part of units or circuits for driving the display may be directly disposed on the display substrate.

SUMMARY

An embodiment of the present disclosure provides a display substrate, including:
- a base including a display region and a peripheral region surrounding the display region;
- a plurality of sub-pixels in the display region;
- a plurality of data lines located in at least the display region and extending in a first direction, where the plurality of data lines are electrically connected to the plurality of sub-pixels;
- a plurality of gate lines located in at least the display region and extending in a second direction, where the plurality of gate lines are electrically connected to the plurality of sub-pixels, and the first direction intersects with the second direction;
- a plurality of pads in the peripheral region;
- a plurality of data leads located in the peripheral region and electrically connected to the plurality of data lines and a plurality of the pads, where the plurality of data leads include a first group of data leads and a second group of data leads;
- a gate driver circuit located in the peripheral region and electrically connected to the plurality of gate lines;
- a plurality of gate drive lines located in the peripheral region and at least partially surrounding the display region, where the plurality of gate drive lines are electrically connected to the gate driver circuit; and
- a plurality of gate leads located in the peripheral region and extending in the first direction, where the plurality of gate leads are electrically connected to the plurality of gate drive lines and a plurality of the pads; and the plurality of gate leads are located between the first group of data leads and the second group of data leads.

In some implementations, the plurality of gate drive lines include a gate start signal line, a first gate clock signal line, a second gate clock signal line, a gate drive test line, a high-level signal line, and a low-level signal line.

In some implementations, the display substrate further includes:
- a plurality of control lines located in at least the display region and extending in the second direction, where the plurality of control lines are electrically connected to the plurality of sub-pixels;
- a control driver circuit located in the peripheral region and electrically connected to the plurality of control lines;
- a plurality of control drive lines located in the peripheral region and at least partially surrounding the display region, where the plurality of control drive lines are electrically connected to the control driver circuit; and
- a plurality of control leads located in the peripheral region and extending in the first direction, where the plurality of control leads are electrically connected to the plurality of control drive lines and a plurality of the pads; and the plurality of control leads are located between the first group of data leads and the second group of data leads.

In some implementations, the plurality of control drive lines include a control start signal line, a first control clock signal line, a second control clock signal line, a control drive test line, a high-level signal line, and a low-level signal line.

In some implementations, the gate driver circuit and the control driver circuit are located on two opposite sides of the display region along the second direction.

In some implementations, the display substrate further includes:
- a multiplexing circuit located in the peripheral region and electrically connected to the plurality of data lines;
- a plurality of data drive lines located in the peripheral region and at least partially surrounding the display region, where the multiplexing circuit is electrically connected to the plurality of data drive lines and the plurality of data leads;
- a plurality of multiplexing drive lines located in the peripheral region and at least partially surrounding the display region, where the plurality of multiplexing drive lines are electrically connected to the multiplexing circuit; and
- a plurality of multiplexing leads located in the peripheral region and extending in the first direction, where the plurality of multiplexing leads are electrically connected to the plurality of multiplexing drive lines and a plurality of the pads; and the plurality of multiplexing leads are located between the first group of data leads and the second group of data leads.

In some implementations, the plurality of gate drive lines, the plurality of multiplexing drive lines and the plurality of data drive lines are located on a side of the gate driver circuit and the multiplexing circuit away from the display region.

In some implementations, the plurality of multiplexing drive lines are located on a side of the plurality of gate drive lines away from the display region; and
the plurality of data drive lines are located on a side of the plurality of multiplexing drive lines away from the display region.

In some implementations, the display substrate further includes:
- a test circuit located in the peripheral region and electrically connected to the plurality of data lines;
- a plurality of test drive lines located in the peripheral region and at least partially surrounding the display region, where the plurality of test drive lines are electrically connected to the test circuit; and
- a plurality of test leads located in the peripheral region and extending in the first direction, where the plurality of test leads are electrically connected to the plurality of test drive lines and a plurality of the pads; and the plurality of test leads are located between the first group of data leads and the second group of data leads.

In some implementations, the plurality of test drive lines include a test data signal line and a test control signal line.

In some implementations, the display substrate further includes:
- a multiplexing circuit located in the peripheral region and electrically connected to the plurality of data lines;

the test circuit and the multiplexing circuit are located on two opposite sides of the display region along the first direction; and the plurality of pads are located on a side of the multiplexing circuit away from the display region.

In some implementations, the display substrate further includes:

an electrostatic discharge circuit in the peripheral region;

an electrostatic discharge drive line located in the peripheral region and at least partially surrounding the display region, where the electrostatic discharge drive line is electrically connected to the electrostatic discharge circuit; and an electrostatic discharge lead located in the peripheral region and extending in the first direction, where the electrostatic discharge lead is electrically connected to the electrostatic discharge drive line and a pad; and the electrostatic discharge lead is located between the first group of data leads and the second group of data leads.

In some implementations, the display substrate further includes:

an initialization drive line located in the peripheral region and at least partially surrounding the display region, where the initialization drive line is electrically connected to the plurality of sub-pixels; and an initialization lead located in the peripheral region and extending in the first direction, where the initialization lead is electrically connected to the initialization drive line and pads; and the initialization lead is located between the first group of data leads and the second group of data leads.

In some implementations, the display substrate further includes:

a first power drive line located in the peripheral region and at least partially surrounding the display region, where the first power drive line is electrically connected to the plurality of sub-pixels;

a first power lead located in the peripheral region and extending in the first direction, where the first power lead is electrically connected to the first power drive line and pads; and the first power lead is located between the first group of data leads and the second group of data leads;

a second power drive line located in the peripheral region and at least partially surrounding the display region, where the second power drive line is electrically connected to the plurality of sub-pixels; and a second power lead located in the peripheral region and extending in the first direction, where the second power lead is electrically connected to the second power drive line and pads; and the second power lead is located on a side of the first group of data leads away from the second group of data leads, or located on a side of the second group of data leads away from the first group of data leads.

In some implementations, the plurality of pads are located in the access region and arranged along the second direction; in the first direction, the access region is located on a side of the display region;

the plurality of gate leads and the plurality of data leads are located in the lead-out region; and in the first direction, the lead-out region is located between the access region and the display region; and in the second direction, the plurality of gate leads are located between the first group of data leads and the second group of data leads.

In some implementations, in the second direction, a plurality of the pads electrically connected to the plurality of gate leads are located between a plurality of the pads electrically connected to the first group of data leads and a plurality of the pads electrically connected to the second group of data leads.

In some implementations, the display substrate further includes:

a plurality of control lines located in at least the display region and extending in the second direction, where the plurality of control lines are electrically connected to the plurality of sub-pixels;

a control driver circuit located in the peripheral region and electrically connected to the plurality of control lines;

a plurality of control drive lines located in the peripheral region and at least partially surrounding the display region, where the plurality of control drive lines are electrically connected to the control driver circuit; and a plurality of control leads located in the peripheral region and extending in the first direction, where the plurality of control leads are electrically connected to the plurality of control drive lines and the pads; and the plurality of control leads are located between the first group of data leads and the second group of data leads.

In some implementations, the display substrate further includes:

a first power drive line located in the peripheral region and at least partially surrounding the display region, where the first power drive line is electrically connected to the plurality of sub-pixels;

a first power lead located in the peripheral region and extending in the first direction, where the first power lead is electrically connected to the first power drive line and pads; and the first power lead is located between the first group of data leads and the second group of data leads;

a second power drive line located in the peripheral region and at least partially surrounding the display region, where the second power drive line is electrically connected to the plurality of sub-pixels; and a second power lead located in the peripheral region and extending in the first direction, where the second power lead is electrically connected to the second power drive line and pads; and the second power lead is located on a side of the first group of data leads away from the second group of data leads, or located on a side of the second group of data leads away from the first group of data leads;

in the second direction, the pads electrically connected to the first power lead are located on a side of the pads electrically connected to the first group of data leads away from the pads electrically connected to the second group of data leads, or located on a side of the pads electrically connected to the second group of data leads away from the pads electrically connected to the first group of data leads; and in the second direction, the pads electrically connected to the second power lead are located on a side of the pads electrically connected to the first group of data leads away from the pads electrically connected to the second group of data leads, or located on a side of the pads electrically connected to the second group of data leads away from the pads electrically connected to the first group of data leads.

In some implementations, the display region is substantially circular; and the display substrate is substantially circular.

In a second aspect, an embodiment of the present disclosure provides a display apparatus, including:
any one of the display substrates as described above.

BRIEF DESCRIPTION OF DRAWINGS

Accompanying drawings are provided for further understanding of the embodiments of the present disclosure and constitute a part of the specification.

Hereinafter, these drawings are intended to explain the present disclosure together with the following embodiments, but should not be considered as a limitation to the present disclosure. The above and other features and advantages will become more apparent to those skilled in the art through detailed description of the exemplary embodiments with reference to the accompanying drawings, in which.

DETAIL DESCRIPTION OF EMBODIMENTS

Figure 1:
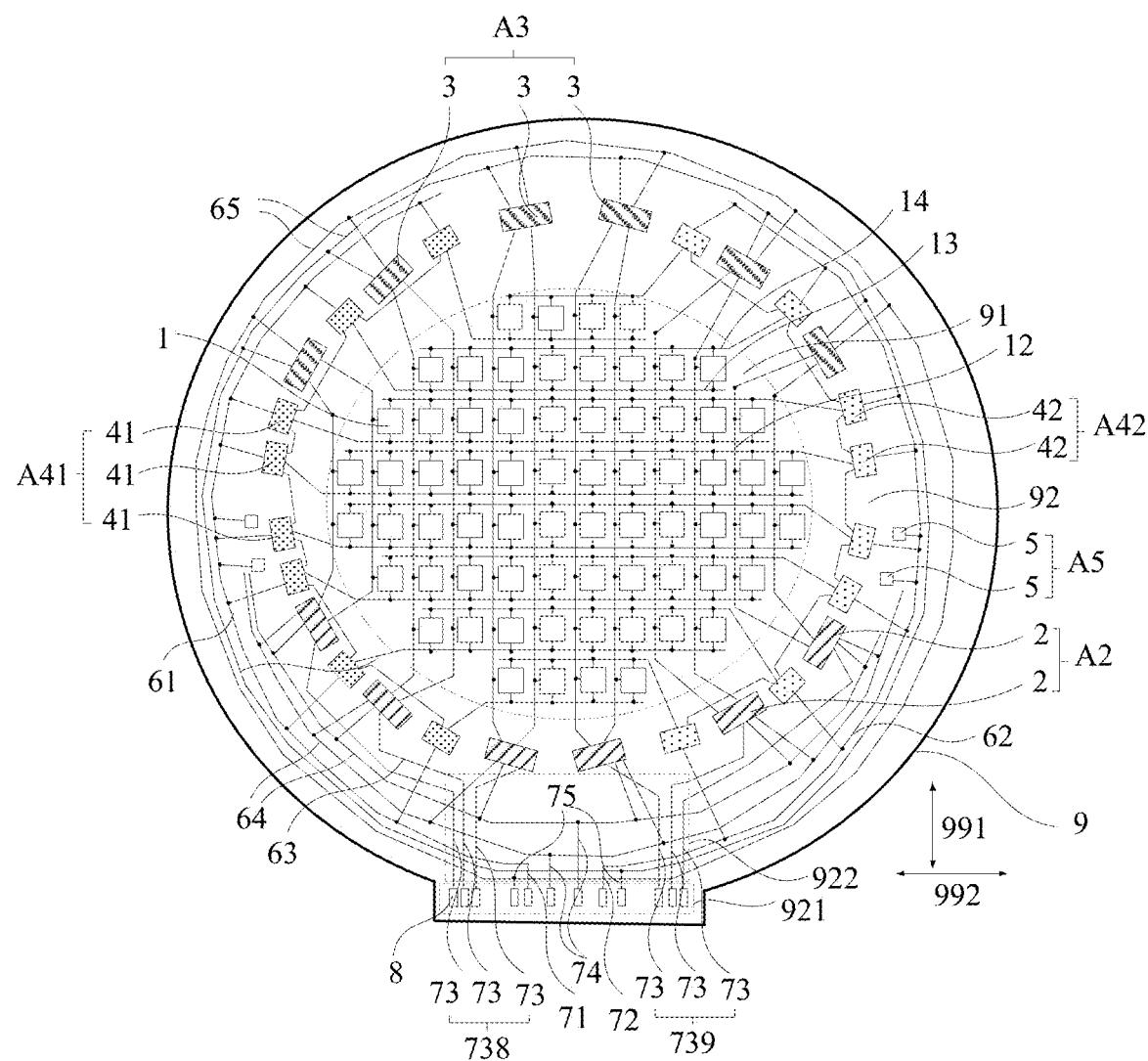
FIG. 1 is a schematic structural top view of a display substrate according to an embodiment of the present disclosure.

To improve understanding of the technical solution in the embodiments of the present disclosure for those skilled in the art, the display substrate and the display apparatus provided in the embodiments of the present disclosure will be described below in detail in conjunction with the accompanying drawings.

Embodiments of the present disclosure will be described more sufficiently below with reference to the accompanying drawings, but which may be embodied in different forms and should not be construed as limited to the embodiments set forth in the present disclosure. Rather, these embodiments are provided so that the present disclosure will be thorough and complete, and will fully convey the scope of the present disclosure to those skilled in the art.

Embodiments described in the present disclosure may be described with reference to plan and/or sectional views in idealized representations of the present disclosure. Accordingly, the example illustrations may be modified in accordance with manufacturing techniques and/or tolerances.

Embodiments of the present disclosure and features of the embodiments may be combined with each other without conflict.

Terminology used in the present disclosure is for the purpose of describing specific embodiments only and is not intended to limit the present disclosure. As used herein, the term "and/or" includes any and all combinations of one or more of the associated listed items. As used herein, the singular forms "a," "an," and "the" are intended to include the plural forms as well, unless the context clearly indicates otherwise. As used herein, the terms "comprise" and "consist of . . . " specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used in the present disclosure have the same meaning as commonly understood by one of ordinary skill in the art. It will be further understood that terms, such as those defined in commonly used dictionaries, should be interpreted as having a meaning that is consistent with their meaning in the context of the existing art and the present disclosure, and will not be interpreted in an idealized or overly formal sense unless expressly so defined in the present disclosure.

The embodiments of the present disclosure are not limited to the embodiments shown in the drawings, but include modifications of configurations formed based on a manufacturing process. Thus, the regions illustrated in the figures have schematic properties, and the shapes of the regions shown in the figures illustrate specific shapes of regions of elements, but are not intended to be limiting.

In the embodiments of the present disclosure, the size of each component, the thickness of a layer, or a region may be exaggerated in the drawings for clarity. Therefore, one implementation of the present disclosure is not necessarily limited to the dimensions, and the shapes and sizes of the components in the drawings do not reflect a true scale. Further, the drawings schematically show ideal examples, and one implementation of the present disclosure is not limited to the shapes, numerical values, and the like shown in the drawings.

In the embodiments of the present disclosure, ordinal numbers such as "first", "second", "third", and the like are provided to avoid confusion of constituent elements, and are not intended to limit the quantity.

In the embodiments of the present disclosure, for convenience, terms indicating orientations or positional relationships such as "middle", "upper", "lower", "front", "rear", "vertical", "horizontal", "top", "bottom", "inner", "outer", and the like are used to explain positional relationships of constituent elements with reference to the drawings, only for convenience of description and simplification of description, but not to indicate or imply that the device or element referred to must have a specific orientation, be configured and operated in a specific orientation, and thus, should not be construed as limiting the present disclosure. The positional relationship of the components is changed as appropriate in accordance with the direction in which each component is described. Therefore, the positional relationship is not limited to the words and phrases described in the description, and may be replaced as appropriate depending on the case.

In the embodiments of the present disclosure, the terms "mounted to", "connected with" and "connected to" are to be construed broadly unless otherwise explicitly specified or limited. For example, it may refer to fixed connection, or detachable connection, or integral connection; it may refer to mechanical connection, or electrical connection; and it may refer to direct connection, indirect connection through an intermedium, or internal communication between two elements. Those ordinary skilled in the art may understand the specific meanings of the above terms in the present disclosure according to the specific context.

In the embodiments of the present disclosure, "A is substantially B" means that, on a scale of the whole, A conforms to feature B, but on a scale significantly smaller than the whole, A may not completely conform to feature B. For example, "A is substantially circular" means that A may be a perfect circle or ellipse, or A may have a circular or elliptical shape generally as a whole, but some detailed structure thereof is not strictly circular: for example, A may have a small part of a straight line, or a broken line, or the like on the boundary; for another example, A may have some projected or recessed positions or the like on the boundary; for yet another example, A may have a small part in the shape of an arc that approximates a circular arc but is not a strict circular arc on the boundary; and for still another example, A may have circular arcs of different diameters at different positions of the boundary.

In the embodiments of the present disclosure, a transistor refers to an element including at least three terminals, i.e., a gate, a drain and a source. The transistor has a channel region between the drain (a drain terminal, a drain region, or a drain electrode) and the source (a source terminal, a source region, or a source electrode), and current can flow through the drain, the channel region, and the source. Note that in this specification, the channel region refers to a region through which most current flows.

In the embodiments of the present disclosure, the first electrode may be a drain and the second electrode may be a source, or the first electrode may be a source and the second electrode may be a drain. In the case of using transistors of opposite polarities, or the case where a direction of current varies during circuit operation, or the like, functions of the "source" and the "drain" may be interchangeable. Therefore, in this specification, the "source" and the "drain" are interchangeable.

In the embodiments of the present disclosure, the reference to "electrically connected" includes a case where constituent elements are connected with each other by an element having some kind of electrical action. The "element having some kind of electrical function" is not particularly limited as long as it can transmit and receive electrical signals between the connected constituent elements. Examples of the "element having some kind of electric function" include not only an electrode and a wire, but also a switch element such as a transistor, a resistor, an inductor, a capacitor, other elements having various functions, and the like.

In the embodiments of the present disclosure, the reference to "parallel" means a state in which two straight lines form an angle of $-10°$ or more and $10°$ or less, and therefore, includes a state in which the angle is $-5°$ or more and $5°$ or less. The reference to "perpendicular" means a state in which two straight lines form an angle of $80°$ or more and $100°$ or less, and therefore, includes a state in which the angle is $85°$ or more and $95°$ or less.

In the embodiments of the present disclosure, "film" and "layer" are interchangeable. For example, "conductive layer" may be sometimes replaced with "conductive film". Similarly, "insulation film" may be sometimes replaced with "insulation layer".

In the embodiments of the present disclosure, "about" means that the boundary is not strictly limited and values within an error margin of the process and measurement are allowed.

In a first aspect, referring to FIGS. 1 to 24, an embodiment of the present disclosure provides a display substrate.

In some figures of the embodiments of the present disclosure, due to the limited space and for the sake of clarifying main structures, some structures are not shown and some structures of the same type are combined and shown as one structure. Therefore, the number, specific positions, specific dimensional relationships, and the like of the structures shown in the figures are merely schematic and do not form any limitation to the embodiments of the present disclosure.

For example, each of the drive line, the lead, and the auxiliary lead corresponding to one circuit is "a group of lines" that may actually include a plurality of lines, but in some figures, one or two lines may be shown to represent the plurality of lines in the same group.

The display substrate in the embodiments of the present disclosure is a substrate used in a display apparatus, such as an array substrate provided with a thin film transistor (TFT) array, and may be further provided with a light-emitting device (such as an organic light-emitting diode) for display.

The display substrate in an embodiment of the present disclosure includes:

a base 9, including a display region 91 and a peripheral region 92 surrounding the display region 91;

a plurality of sub-pixels 1 in the display region 91;

a plurality of data lines 12 located in at least the display region 91 and extending in a first direction 991, where the plurality of data lines 12 are electrically connected to the plurality of sub-pixels 1;

a plurality of gate lines 13 located in at least the display region 91 and extending in a second direction 992, where the plurality of gate lines 13 are electrically connected to the plurality of sub-pixels 1; and the first direction 991 intersects with the second direction 992;

a plurality of pads 8 in the peripheral region 92;

a plurality of data leads 73 located in the peripheral region 92 and electrically connected to the plurality of data lines 12 and the plurality of pads 8, where the plurality of data leads 73 include a first group of data leads 738 and a second group of data leads 739;

a gate driver circuit A41 located in the peripheral region 92 and electrically connected to the plurality of gate lines 13;

a plurality of gate drive lines 61 located in the peripheral region 92 and at least partially surrounding the display region 91, where the plurality of gate drive lines 61 are electrically connected to the gate driver circuit A41; and a plurality of gate leads 71 located in the peripheral region 92 and extending in the first direction 991, where the plurality of gate leads 71 are electrically connected to the plurality of gate drive lines 61 and the plurality of pads 8; and the plurality of gate leads 71 are located between the first group of data leads 738 and the second group of data leads 739.

Figure 7:
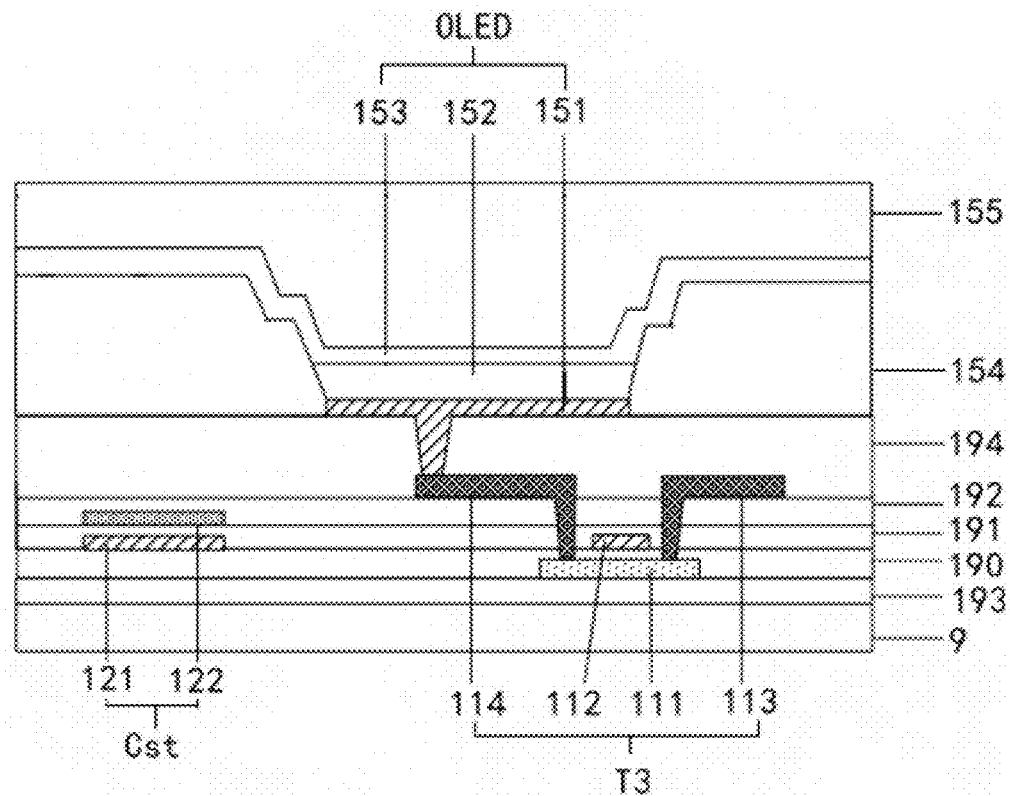
FIG. 7 is a schematic structural diagram illustrating a partial section of a sub-pixel in a display substrate according to an embodiment of the present disclosure.
Figure 8:
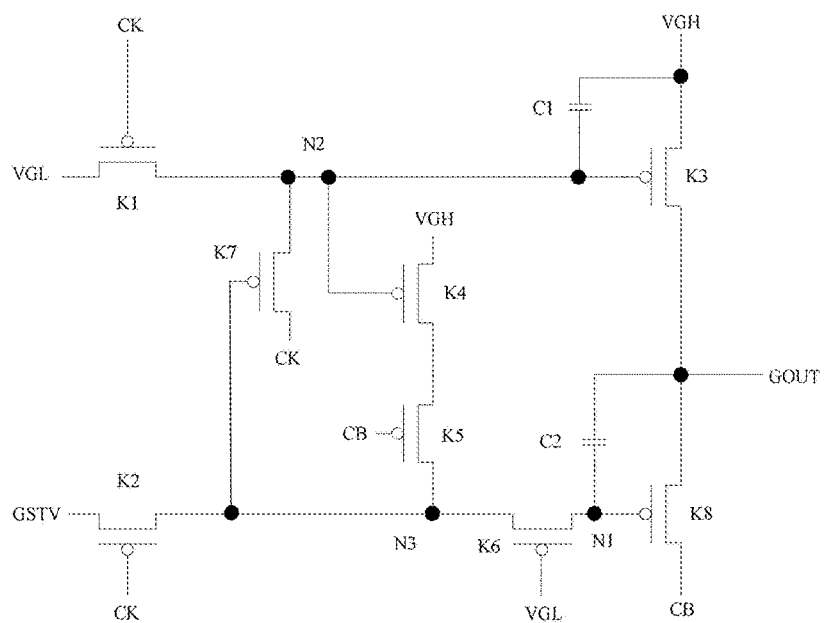
FIG. 8 is a circuit diagram of a gate shift register in a display substrate according to an embodiment of the present disclosure.

Referring to FIGS. 1 and 7, various structures of the display substrate according to the embodiment of the present disclosure are disposed on the "base 9".

The base 9 is a foundation configured to carry other structures of the display substrate, which is a substantially sheet-shaped structure made of a material including glass, silicon (such as monocrystalline silicon), a polymer material (such as polyimide), or the like, and may be rigid or flexible, with a thickness in the millimeter order.

The base 9 includes a display region 91 in the central portion, and a peripheral region 92 surrounding the display region 91.

The display region 91 is provided with a plurality of sub-pixels 1 for display therein.

Each sub-pixel 1 is a smallest structure that can be used to independently display the desired content, i.e., a smallest "dot" that can be independently controlled in a display apparatus.

Different sub-pixels 1 may have different colors so that color display can be implemented by mixing light of different sub-pixels 1. To implement the color display, a plurality of sub-pixels 1 of different colors may be arranged together to form a "pixel (or pixel unit)". In other words, light emitted from these sub-pixels 1 is mixed to form a "dot" visually. For example, three sub-pixels 1 of three colors, i.e., red, green, and blue, may constitute one pixel. Alternatively, there may be no explicit pixel (or pixel unit), and instead, the color display is achieved by "sharing" between adjacent sub-pixels 1.

Referring to FIG. 1, data lines 12 extending in a first direction 991 and gate lines 13 extending in a second direction 992 are further provided in the display region 91.

The first direction 991 intersects with (i.e., is not parallel to) the second direction 992. As a result, each intersection of the data lines 12 and the gate lines 13 may define a sub-pixel 1, and the sub-pixels 1 at the intersections may be used for display by controlling with both the gate lines 13 and the data lines 12. In addition, the display region 91 may be further provided with control lines 14 extending in the second direction 992, which also function to control the sub-pixels 1.

In some implementations, the first direction 991 is perpendicular to the second direction 992. That is, the first direction 991 may be a column direction (the longitudinal direction in the figures) and the second direction 992 may be a row direction (the horizontal direction in the figures) perpendicular to the column direction.

It will be appreciated that the first direction 991 and the second direction 992 are actually two relative directions corresponding to the data lines 12 and the gate lines 13 (or the control lines 14), and but not necessarily the column direction and the row direction, and have no necessary relationship with the shape, position, placement, and the like of the display substrate (or the display apparatus).

In some implementations, the sub-pixels 1 in the display region 91 may be arranged in an array. That is, the sub-pixels 1 may be arranged in a plurality of rows and a plurality of columns, where each row of sub-pixels 1 are connected to one of the gate lines 13 and one of the control lines 14, and each column of sub-pixels 1 are connected to one of the data lines 12.

It will be appreciated that the sub-pixels 1 are not necessarily arranged in an array, and it is not necessary that each data line 12, each gate line 13, and each control line 14 are connected to the same column or same row of sub-pixels 1.

Figure 6:
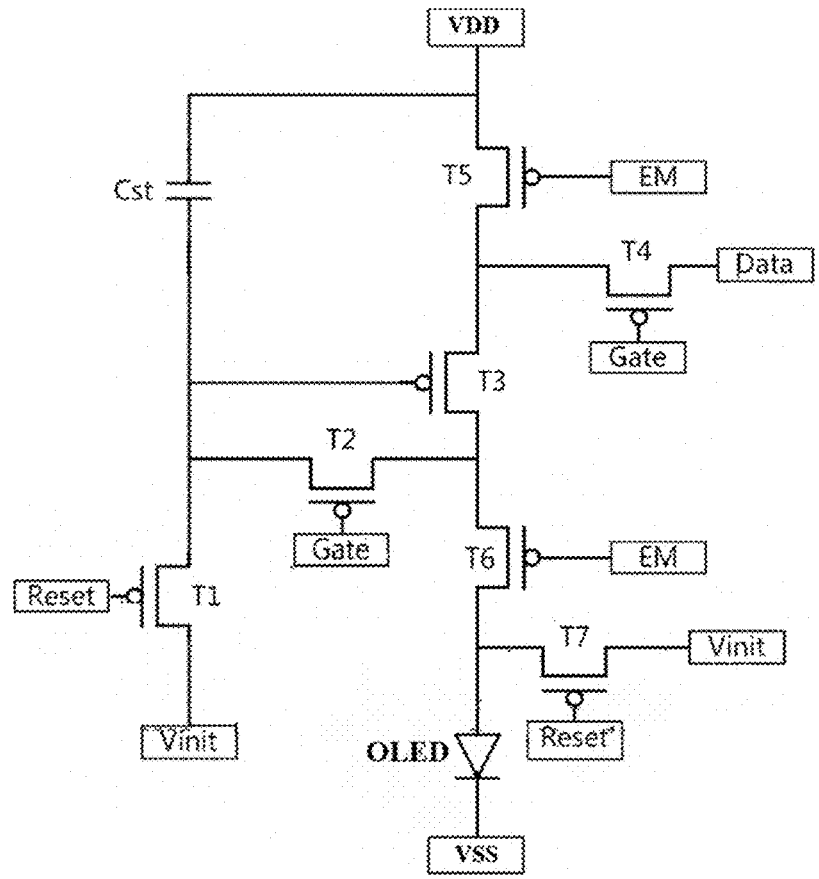
FIG. 6 is a circuit diagram of a sub-pixel in a display substrate according to an embodiment of the present disclosure.

Illustratively, each of the sub-pixels 1 may include a pixel circuit that may emit light of a desired brightness under the control of the corresponding gate line 13, data line 12, and the like. For example, the pixel circuit may have a 7T1C structure (i.e., including 7 transistors and 1 capacitor). Referring to FIG. 6, the 7T1C pixel circuit may include a first transistor T1, a second transistor T2, a third transistor T3, a fourth transistor T4, a fifth transistor T5, a sixth transistor T6, a seventh transistor T7, a storage capacitor Cst, an organic light-emitting diode OLED, a first reset terminal Reset, a second reset terminal Reset', an initialization signal terminal Vinit, a gate line terminal Gate, a data line terminal Data, a control terminal EM, a first power signal terminal VDD, a second power signal terminal VSS, and the like; where each transistor may be a P-type transistor (e.g., PMOS).

In other words, in each sub-pixel 1 of the display substrate according to the embodiment of the present disclosure, the organic light-emitting diode OLED may be used as a light-emitting device, the display substrate is specifically an organic light-emitting diode display substrate, as well as an array substrate provided with a thin film transistor (TFT) array.

Referring to FIG. 7, in some implementations, the third transistor T3 in each sub-pixel 1 is a driving transistor, in which the specific structure and stacking relationship of some devices may be as follows:

The driving transistor (third transistor T3) includes:

a first active layer 111 on a side of the base 9;

a gate insulation layer 190 on a side of the first active layer 111 away from the base 9;

a first gate 112 on a side of the gate insulation layer 190 away from the base 9;

a first insulation layer 191 on a side of the first gate 112 away from the base 9;

a second insulation layer 192 (interlayer insulation layer ILD) on a side of the first insulation layer 191 away from the base 9; and a first source 113 and a first drain 114 which are located on a side of the second insulation layer 192 away from the base 9 and electrically connected to the first active layer 111.

The storage capacitor Cst includes:

a first electrode sheet 121 disposed in a same layer as the first gate 112; and a second electrode sheet 122 located between the first insulation layer 191 and the second insulation layer 192.

Apparently, the sub-pixels 1 may further include other structures.

Apparently, the specific structures of the sub-pixels 1 and the pixel circuit are not limited to the above.

The data line terminal Data may be connected to the data line 12, the gate line terminal Gate may be connected to the gate line 13, the control terminal EM may be connected to the control line 14, the first reset terminal Reset and the second reset terminal Reset' may be both connected to a gate line 13 for a previous row of sub-pixels, the second reset terminal Reset' may be also connected to a gate line 13 for a current row of sub-pixels, and the rest terminals (e.g., the initialization signal terminal Vinit, the first power signal terminal VDD, and the second power signal terminal VSS) may be connected to corresponding signal sources which may be "lines" or integral conductive structures.

The signals for the above data lines 12, gate lines 13, control lines 14, and signals from the signal sources supplying power to the initialization signal terminal Vinit, the first power signal terminal VDD, and the second power signal terminal VSS are essentially provided directly (e.g., by connecting the drive lines directly to the lines or signal sources in the display region 91) or indirectly (e.g., by connecting the drive lines to the lines or signal sources in the display region 91 through some units) through various drive lines disposed in the peripheral region 92 and surrounding or partially surrounding the display region 91.

The various drive lines connect the "leads" in the peripheral region 92 extending in the first direction 991; and each "lead" is then connected to the corresponding pad 8, either directly or indirectly (e.g., through an auxiliary lead). In other words, the signals driving the sub-pixels 1 essentially comes from the "pads 8".

Here, the pads (or pins) 8 refer to structures in the peripheral region 92 of the display substrate that can acquire other signals and finally introduce the signals to the sub-pixels 1.

Specifically, the pads 8 may be configured to be connected to a flexible circuit board (FPC) or a driver chip in a bonding manner, so as to obtain signals from the FPC or the driver chip; or the pads 8 may be configured to contact test probes of a testing device to obtain signals from (or return signals to) the test probes.

The data leads 73 that are finally electrically connected to the data lines 12 (through the data drive lines 63 in the peripheral region 92) include two groups, i.e., a first group of data leads 738 and a second group of data leads 739, and most of the rest leads (including at least the gate leads 71 that are finally electrically connected to the gate lines 13) are located "between" the first group of data leads 738 and the second group of data leads 739.

That is, in the embodiment of the present disclosure, the data leads 73 are located "outside" (e.g., outside in the second direction 992) relative to the rest test leads 75.

Compared with other leads, the number of data leads 73 is generally the largest. Therefore, the data leads 73 occupy a relatively large fanout region when changing from extending in the first direction 991 (the longitudinal direction) to extending around the display region 91 (i.e., the data drive lines 63).

In the embodiment of the present disclosure, the data leads 73 are disposed on two sides of other leads (in other words, closer to the edges) to be closer to two edges of the peripheral region 92, which can facilitate the fanout and reduce a wiring area and a bezel width of the display apparatus, thereby implementing a narrow-bezel design.

Figure 5:
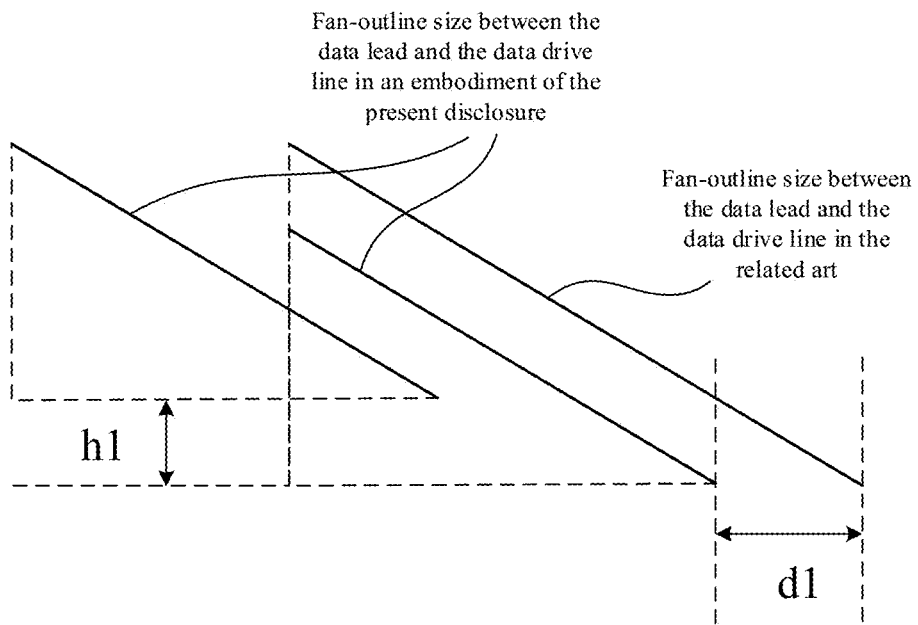
FIG. 5 is a schematic diagram illustrating a position occupied by a partial structure of a display substrate according to an embodiment of the present disclosure.

For example, referring to FIG. 5, when the data leads 73 have a same length in the first direction 991, it is equivalent to that a start point of fanout lines (connection lines between the data leads 73 and the data drive lines 63) is "closer to the side edge", so that compared with the case where the data leads 73 are disposed in the middle, a dimension d1 is saved in the second direction 992, or a dimension h1 is saved in the first direction 991, thereby reducing a size of the peripheral region 92 and realizing a narrow-bezel design.

In some implementations, the display region 91 is substantially circular; and the display substrate is substantially circular.

Figure 2:
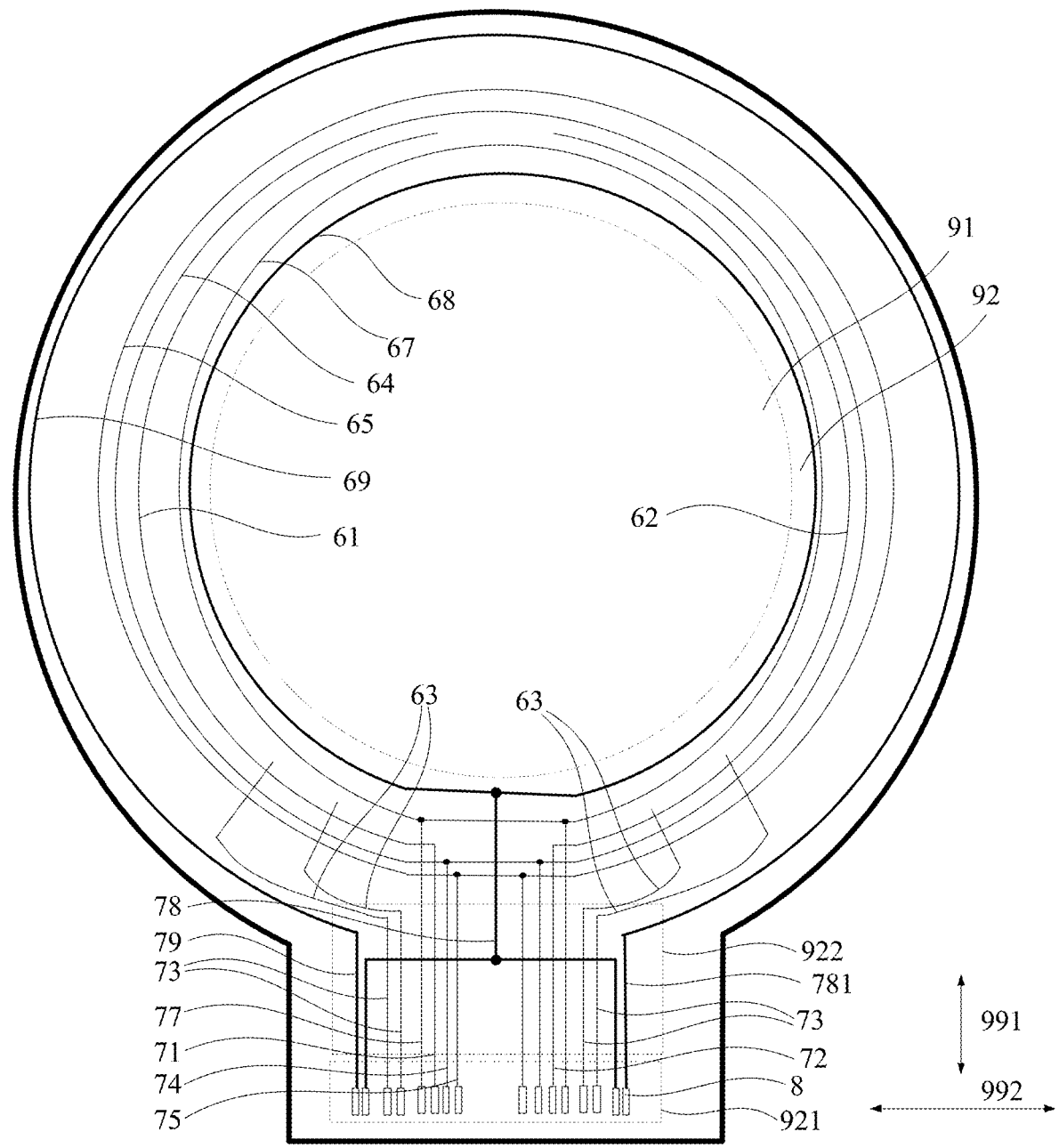
FIG. 2 is a schematic structural top view illustrating a layout of a portion of leads in a display substrate according to an embodiment of the present disclosure.

Referring to FIGS. 1 and 2, as an implementation of the embodiments of the present disclosure, the display region 91 and the display substrate may be both substantially circular so that the peripheral region 92 outside the display region 91 is substantially a "circular ring", and the whole display apparatus corresponding to the display substrate is also substantially circular, such as a circular "smart watch".

Apparently, the above shapes are not intended to limit the specific forms of the display substrate and the regions thereof, and the display substrate and the regions thereof may have other shapes.

In some implementations, the plurality of gate drive lines 61 include a gate start signal line 611, a first gate clock signal line 612, a second gate clock signal line 613, a gate drive test line 614, a high-level signal line 615, and a low-level signal line 616.

Figure 18:
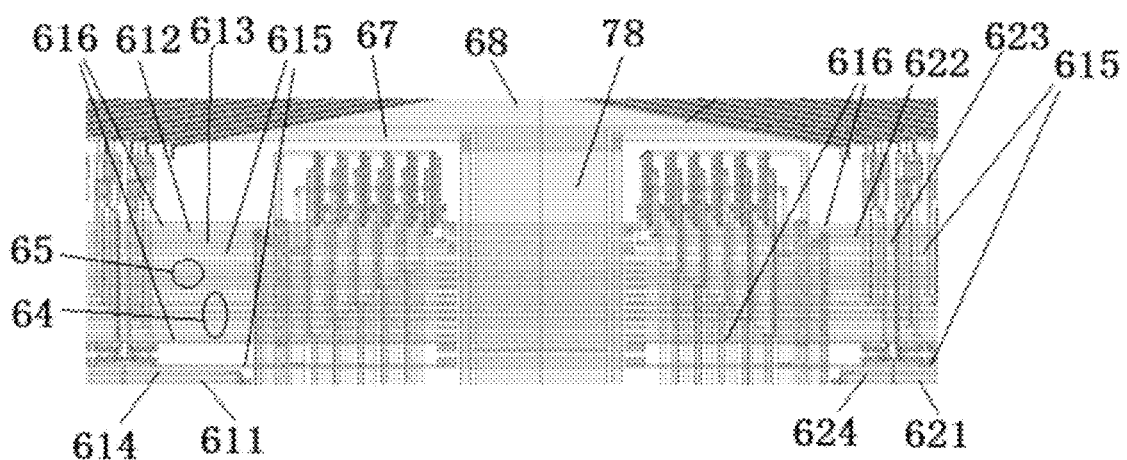
FIG. 18 shows a partially enlarged structural design layout at location D of the display substrate of FIG. 4.

Referring to FIG. 18, the gate drive lines 61 may specifically include a gate start signal line 611, a first gate clock signal line 612, a second gate clock signal line 613, a gate drive test line 614, a high-level signal line 615, and a low-level signal line 616.

Referring to FIG. 1, the gate driver circuit A41 may consist of a plurality of gate drive units 41 each providing a gate drive signal to one of the gate lines 13. The gate drive units 41 may be located on two sides of the display region 91 along the second direction 992 (the row direction in the figures) to provide gate drive signals for different rows of gate lines 13 respectively, or simultaneously provide gate drive signals for the gate lines 13 from both sides (double-side driving).

Specifically, each gate drive unit 41 may be a gate shift register (GOA), and a plurality of gate shift registers are cascaded so that the plurality of gate shift registers can provide drive signals for the plurality of gate lines 13, respectively.

The specific form of the gate shift register may vary. Illustratively, the circuit structure and driving timing of the gate shift register may refer to FIGS. 8, 20, and 9. Specifically, the low level of each signal below may be equal to a low-level signal VGL, and the high level of each signal may be equal to the high-level signal VGH.

At an input stage t1, a first gate clock signal CK is at a low level, a second gate clock signal CB is at a high level, and a gate start signal GSTV is at a low level. Since the first gate clock signal CK is at a low level, a second gate transistor K2 is turned on, and the gate start signal GSTV is transmitted to a third gate node N3 via the second gate transistor K2. Since the second gate transistor K2 has a threshold loss, a level of the third gate node N3 is GSTV−Vth2, i.e., VGL−Vth2, where Vth2 represents a threshold level of the second gate transistor K2. Since a gate of a sixth gate transistor K6 receives the low-level signal VGL, the sixth gate transistor K6 is in a turn-on state, and thus, the level VGL−Vth2 is transmitted to a first gate node N1 via the sixth gate transistor K6. For example, a threshold level of the sixth gate transistor K6 is denoted by Vth6, and similarly, since the sixth gate transistor K6 has a threshold loss, the level of the first gate node N1 is VGL−VthN1, where VthN1 is the smaller one of Vth2 and Vth6. The level of the first gate node N1 may control an eighth gate transistor K8 to be turned on, and the second gate clock signal CB is transmitted as a gate output signal GOUT via the eighth gate transistor K8. That is, at the input stage t1, the gate output signal GOUT is the second gate clock signal CB at a high level, i.e., equals to VGH.

At the input stage t1, since the first gate clock signal CK is at a low level, a first gate transistor K1 is turned on, and the low-level signal VGL is transmitted to a second gate node N2 via the first gate transistor K1. Since the level of the third gate node N3 is VGL−Vth2, a seventh gate transistor K7 is turned on, and the first gate clock signal CK at a low level is transmitted to the second gate node N2 via the seventh gate transistor K7. For example, a threshold level of the seventh gate transistor K7 is denoted by Vth7, and a threshold level of the first gate transistor K1 is denoted by Vth1. When Vth1<Vth7+Vth2, the level of the second gate node N2 is VGL−Vth7−Vth2; and when Vth1>Vth7+Vth2, the level of the second gate node N2 is VGL−Vth1. At this time, both the third gate transistor K3 and the fourth gate transistor K4 are turned on. Since the second gate clock signal CB is at a high level, a fifth gate transistor K5 is turned off.

At an output stage t2, the first gate clock signal CK is at a high level, the second gate clock signal CB is at a low level, and the gate start signal GSTV is at a high level. The eighth gate transistor K8 is turned on, and the second gate clock signal CB is transmitted as a gate output signal GOUT via the eighth gate transistor K8. At the input stage t1, a level at one end of a second gate capacitor C2 connected to the first gate node N1 is VGL−VthN1, while the other end of the second gate capacitor C2 is at a high level.

At the output stage t2, the level at the end of the second gate capacitor C2 connected to the output terminal GOUT becomes VGL, and due to a bootstrap effect of the second gate capacitor C2, the level at one end of the second gate capacitor C2 connected to the first gate node N1 becomes 2VGL−VthN1−VGH. That is, the level of the first gate node N1 becomes 2VGL−VthN1−VGH. At this time, the sixth gate transistor K6 is turned off, the eighth gate transistor K8 can be better turned on, and the gate output signal GOUT is the low-level signal VGL.

At the output stage t2, the first gate clock signal CK is at a high level so that the second gate transistor K2 and the first gate transistor K1 are both turned off. The level of the third gate node N3 is still VGL−VthN2, the seventh gate transistor K7 is turned on, and the first gate clock signal CK at a high level is transmitted to the second gate node N2 via the seventh gate transistor K7. That is, the level of the second gate node N2 is VGH. Thereby, both the third gate transistor K3 and the fourth gate transistor K4 are turned off. Since the second gate clock signal CB is at a low level, the fifth gate transistor K5 is turned on.

At a buffer stage t3, both the first gate clock signal CK and the second gate clock signal CB are at a high level, and the gate start signal GSTV is at a high level. The eighth gate transistor K8 is turned on, and the second gate clock signal CB is transmitted as the gate output signal GOUT via the eighth gate transistor K8. At this time, the gate output signal GOUT is the second gate clock signal CB at a high level, i.e., VGH. Due to a bootstrap effect of the second gate capacitor C2, the level of the first gate node N1 becomes VGL−VthN1.

At the buffer stage t3, the first gate clock signal CK is at a high level so that the second gate transistor K2 and the first gate transistor K1 are both turned off. The level of the first gate node N1 becomes VGL−VthN1. At this time, the sixth gate transistor K6 is turned on, the level of the third gate node N3 is also VGL−VthN1, the seventh gate transistor K7 is turned on, and the first gate clock signal CK at a high level is transmitted to the second gate node N2 via the seventh gate transistor K7. That is, the level of the second gate node N2 is VGH. Thereby, both the third gate transistor K3 and the fourth gate transistor K4 are turned off. Since the second gate clock signal CB is at a high level, the fifth gate transistor K5 is turned off.

At a first sub-stage t41 of a stabilization stage t4, the first gate clock signal CK is at a low level, the second gate clock signal CB is at a high level, and the gate start signal GSTV is at a high level. Since the first gate clock signal CK is at a low level, the second gate transistor K2 is turned on, and the gate start signal GSTV is transmitted to the third gate node N3 via the second gate transistor K2. Since the second gate transistor K2 can deliver a high level without any threshold loss, the level of the third gate node N3 is VGH, and the seventh gate transistor K7 is turned off. Since the sixth gate transistor K6 is in a turn-on state, the level of the first gate node N1 is the same as that of the third gate node N3. That is, the level of the first gate node N1 is VGH, and the eighth gate transistor K8 is turned off. Since the first gate clock signal CK is at a low level, the first gate transistor K1 is turned on, the level of the second gate node N2 is VGL−Vth1, both the third gate transistor K3 and the fourth gate transistor K4 are turned on, and the high-level signal VGH is transmitted as the gate output signal GOUT via the third gate transistor K3. In other words, the gate output signal is the high-level signal VGH.

At a second sub-stage t42 of the stabilization stage t4, the first gate clock signal is at a high level, the second gate clock signal is at a low level, and the gate start signal GSTV is at a high level. The first gate node N1 and the third gate node N3 each have a level VGH, and the eighth gate transistor K8 and the seventh gate transistor K7 are both turned off. The first gate clock signal CK is at a high level so that the second gate transistor K2 and the first gate transistor K1 are both turned off. Due to a holding effect of the first gate capacitor C1, the level of the second gate node N2 is still VGL−Vth1, both the third gate transistor K3 and the fourth gate transistor K4 are turned on, and the high-level signal VGH is transmitted as the gate output signal GOUT via the third gate transistor K3. In other words, the gate output signal is the high-level signal VGH.

In the second sub-stage t42, since the second gate clock signal CB is at a low level, the fifth gate transistor K5 is turned on so that the high-level signal VGH is transmitted to the third gate node N3 and the first gate node N1 via the fourth gate transistor K4 and the fifth gate transistor K5, holding the first gate node N1 and the third gate node N3 each at a high level.

At a third sub-stage t43 of the stabilization stage t4, both the first gate clock signal CK and the second gate clock signal CB are at a high level, and the gate start signal GSTV is at a high level. The first gate node N1 and the third gate node N3 each have a level VGH, and the eighth gate transistor K8 and the seventh gate transistor K7 are turned off. The first gate clock signal CK is at a high level so that the second gate transistor K2 and the first gate transistor K1 are both turned off. The level of the second gate node N2 is still VGL−Vth1, and both the third gate transistor K3 and the fourth gate transistor K4 are turned on. The high-level signal VGH is transmitted as the gate output signal GOUT via the third gate transistor K3. In other words, the gate output signal is the high-level signal VGH.

The first gate clock signal CK as described above may be provided through the first gate clock signal line 612, while the second gate clock signal CB may be provided through the second gate clock signal line 613, and the high-level signal VGH and the low-level signal VGL may be provided through the high-level signal line 615 and the low-level signal line 616, respectively.

The gate start signal GSTV is provided through the gate output signal GOUT of a gate shift register of a previous stage, the gate start signal GSTV of a gate shift register of a first stage is provided through the gate start signal line 611, and the gate output signal GOUT generated from a gate shift register of a last stage is further connected to the gate drive test line 614 to detect whether the gate driver circuit A41 is in normal operation.

In some implementations, the display substrate further includes:
- a plurality of control lines 14 located in at least the display region 91 and extending in the second direction 992, where the plurality of control lines 14 are electrically connected to the plurality of sub-pixels 1;
- a control driver circuit A42 located in the peripheral region 92 and electrically connected to the plurality of control lines 14;
- a plurality of control drive lines 62 located in the peripheral region 92 and at least partially surrounding the display region 91, where the plurality of control drive lines 62 are electrically connected to the control driver circuit A42; and
- a plurality of control leads 72 located in the peripheral region 92 and extending in the first direction 991, where the plurality of control leads 72 are electrically connected to the plurality of control drive lines 62 and the plurality of pads 8; and the plurality of control leads 72 are located between the first group of data leads 738 and the second group of data leads 739.

Referring to FIG. 1, signals to the control lines 14 may be provided through the control driver circuit A42 that is driven by the control drive lines 62. The control drive lines 62 are connected to the control leads 72 extending in the first direction 991. The control leads 72 are also located between the first group of data leads 738 and the second group of data leads 739.

In some implementations, referring to FIG. 18, the plurality of control drive lines 62 include a control start signal line 621, a first control clock signal line 622, a second control clock signal line 623, a control drive test line 624, a high-level signal line 615, and a low-level signal line 616.

Referring to FIG. 1, the control driver circuit A42 may consist of a plurality of control drive units 42 each providing a control drive signal to one of the control lines 14. The control drive units 42 may be located on two sides of the display region 91 along the second direction 992 (the row direction in the figures) to provide control drive signals for different rows of control lines 14 respectively, or simultaneously provide control drive signals for the control lines 14 from both sides (double-side driving).

Specifically, each control drive unit 42 may be a control shift register (EM GOA), and a plurality of control shift registers are cascaded so that the plurality of control shift registers can provide drive signals for the plurality of control lines 14, respectively.

The specific form of the control shift register may vary. Illustratively, the circuit structure and driving timing of each control shift registers may refer to FIGS. 10, 21, and 11. Specifically, the low level of each signal below may be equal to a low-level signal VGL, and the high level of each signal may be equal to the high-level signal VGH.

In a first stage P1, a first control clock signal CK' is at a low level so that a first control transistor M1 and a third control transistor M3 are turned on, and the turned-on first control transistor M1 transmits a control start signal ESTV at a high level to a first control node N1', so that a level of the first control node N1' becomes a high level, and a second control transistor M2, an eighth control transistor M8 and a tenth control transistor M10 are turned off. In addition, the turned-on third control transistor M3 transmits a low-level signal VGL to a second control node N2', so that a level of the second control node N2' becomes a low level, and so that a fifth control transistor M5 and a sixth control transistor M6 are turned on. Since a second control clock signal CB' is at a high level, a seventh control transistor M7 is turned off. In addition, due to a storage effect of a third control capacitor C3', a fourth control node N4' may remain at a high level, so that a ninth control transistor M9 is turned off. In the first stage P1, since the ninth control transistor M9 and the tenth control transistor M10 are both turned off, the control output signal EMOUT remains at the previous low level.

In a second stage P2, the second control clock signal CB' is at a low level so that the fourth control transistor M4 and the seventh control transistor M7 are turned on. Since the first control clock signal CK' is at a high level, the first control transistor M1 and the third control transistor M3 are turned off. Due to a storage effect of a first control capacitor C1', the second control node N2' may continue to remain at the low level of the previous stage, so that the fifth control transistor M5 and the sixth control transistor M6 are turned on. The high-level signal VGH is transmitted to the first control node N1' through the turned-on fifth control transistor M5 and fourth control transistor M4, so that the first control node N1' remains at the high level of the previous stage, and the second control transistor M2, the eighth control transistor M8 and the tenth control transistor M10 are turned off. In addition, the second control clock signal CB' at a low level is transmitted to the fourth control node N4' through the turned-on sixth control transistor M6 and seventh control transistor M7, so that the level of the fourth control node N4' becomes a low level, and the ninth control transistor M9 is turned on and then outputs the high-level signal VGH, so that the control output signal EMOUT is at a high level.

In a third stage P3, the first control clock signal CK' is at a low level, so that the first control transistor M1 and the third control transistor M3 are turned on. The second control clock signal CB' is at a high level, so that the fourth control transistor M4 and the seventh control transistor M7 are turned off. Due to the storage effect of the third control capacitor C3', the fourth control node N4' may remain at the low level of the previous stage, so that the ninth control transistor M9 remains in the turned-on state, and the turned-on ninth control transistor M9 outputs the high-level signal VGH so that the control output signal EMOUT remains at the high level.

In a fourth stage P4, the first control clock signal CK' is at a high level, so that the first control transistor M1 and the third control transistor M3 are turned off. The second control clock signal CB' is at a low level, so that the fourth control transistor M4 and the seventh control transistor M7 are turned on. Due to a storage effect of the second control capacitor C2', the first control node N1' remains at the high level of the previous stage, so that the second control transistor M2, the eighth control transistor M8 and the tenth control transistor M10 are turned off. Due to the storage effect of the first control capacitor C1', the second control node N2' continues to remain at the low level of the previous stage, so that the fifth control transistor M5 and the sixth control transistor M6 are turned on. In addition, the second control clock signal CB' at a low level is transmitted to the fourth control node N4' through the turned-on sixth control transistor M6 and seventh control transistor M7, so that the level of the fourth control node N4' becomes a low level, and the ninth control transistor M9 is turned on and then outputs the high-level signal VGH, so that the control output signal EMOUT remains at the high level.

In a fifth stage P5, the first control clock signal CK' is at a low level, so that the first control transistor M1 and the third control transistor M3 are turned on. The second control clock signal CB' is at a high level, so that the fourth control transistor M4 and the seventh control transistor M7 are turned off. The turned-on first control transistor M1 transmits a control start signal ESTV at a low level to the first control node N1', so that the level of the first control node N1' becomes a low level, and the second control transistor M2, the eighth control transistor M8 and the tenth control transistor M10 are turned on. The turned-on second control transistor M2 transmits the first control clock signal CK' at a low level to the second control node N2', so that the level of the second control node N2' can be further lowered, and the second control node N2' continues to remain at the low level of the previous stage, so that the fifth control transistor M5 and the sixth control transistor M6 are turned on. In addition, the turned-on eighth control transistor M8 transmits the high-level signal VGH to the fourth control node N4', so that the level of the fourth control node N4' becomes a high level, and the ninth control transistor M9 is turned off. The turned-on tenth control transistor M10 outputs the low-level signal VGL, so that the level of the control output signal EMOUT becomes a low level.

The first control clock signal CK' as described above may be provided through the control clock signal line 622, while the second control clock signal CB' may be provided through the second control clock signal line 623, and the high-level signal VGH and the low-level signal VGL may be provided through the high-level signal line 615 and the low-level signal line 616, respectively.

The control start signal ESTV is provided through the control output signal EOUT from a control shift register of a previous stage, the control start signal ESTV of the control shift register of a first stage is provided through the control start signal line 621, and the control output signal EOUT generated from the control shift register of a last stage is further connected to the control drive test line 624 to detect whether the control driver circuit A42 is in normal operation.

Figure 9:
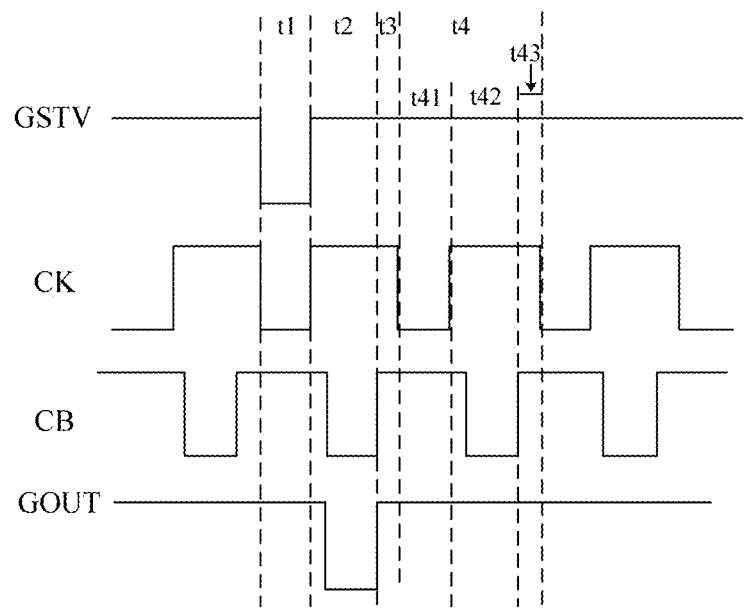
FIG. 9 is a driving timing diagram of the gate shift register of FIG. 8.
Figure 10:
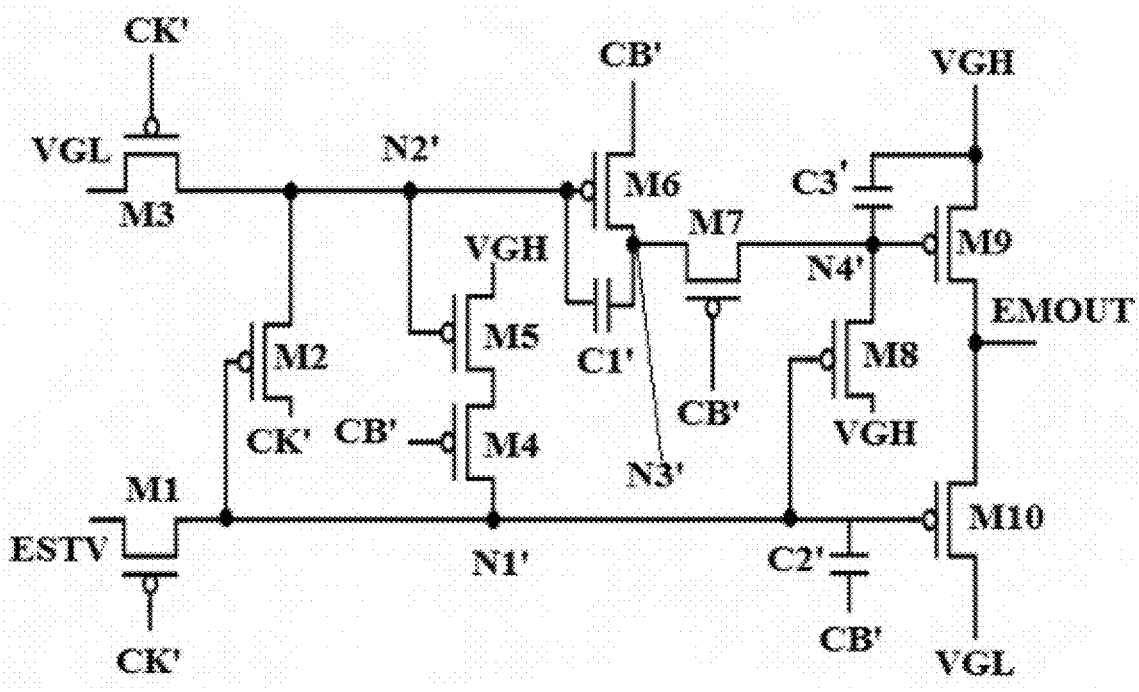
FIG. 10 is a circuit diagram of a control shift register in a display substrate according to an embodiment of the present disclosure.
Figure 11:
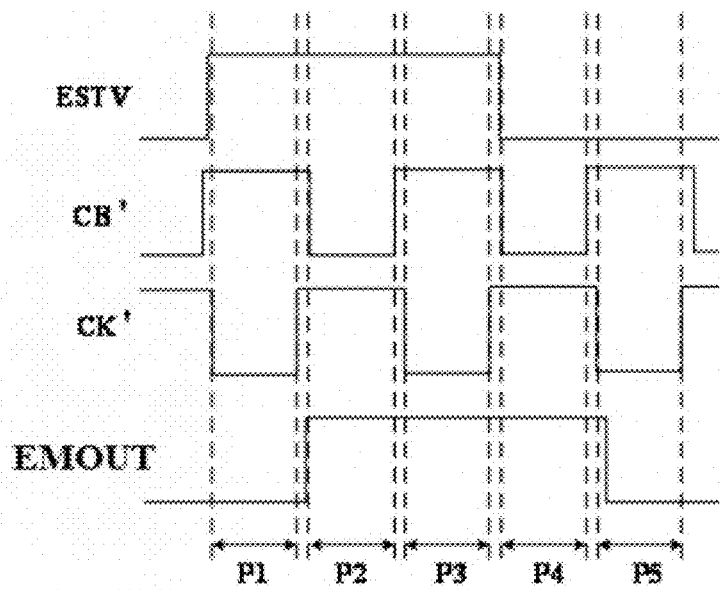
FIG. 11 is a driving timing diagram of the control shift register of FIG. 10.

Referring to FIGS. 9 and 11, since the high-level signals VGH and the low-level signals VGL used in the gate driver circuit A41 and the control driver circuit A42 are the same, respectively, referring to FIG. 18, the high-level signal lines 615 of the gate drive line 61 and the control drive line 62 may be in fact a same line, and the low-level signal lines 616 of the gate drive line 61 and the control drive line 62 may be in fact a same line.

In some implementations, the gate driver circuit A41 and the control driver circuit A42 are located on two opposite sides of the display region 91 along the second direction 992.

Referring to FIG. 1, since the gate driver circuit A41 and the control driver circuit A42 respectively correspond to the gate lines 13 and the control lines 14, and the gate lines 13 and the control lines 14 both extend in the second direction 992, the gate driver circuit A41 (a plurality of gate drive units 41) and the control driver circuit A42 (a plurality of control drive units 42) may be arranged opposite to each other along the second direction 992 for easy wiring.

In some implementations, the display substrate further includes:
- a multiplexing circuit A2 located in the peripheral region 92 and electrically connected to the plurality of data lines 12;
- a plurality of data drive lines 63 located in the peripheral region 92 and at least partially surrounding the display region 91, where the multiplexing circuit A2 is electrically connected to the plurality of data drive lines 63 and the plurality of data leads 73;
- a plurality of multiplexing drive lines 64 located in the peripheral region 92 and at least partially surrounding the display region 91, where the plurality of multiplexing drive lines 64 are electrically connected to the multiplexing circuit; and
- a plurality of multiplexing leads 74 located in the peripheral region 92 and extending in the first direction 991, where the plurality of multiplexing leads 74 are electrically connected to the plurality of multiplexing drive lines 64 and the plurality of pads 8; and the plurality of multiplexing leads 74 are located between the first group of data leads 738 and the second group of data leads 739.

Referring to FIG. 1, in some implementations, the display substrate may include the multiplexing circuit A2 configured to enable each data drive line 63 to be connected with different data lines 12 in a time-division manner under the control of the plurality of multiplexing drive lines 64. Therefore, each data drive line 63 (or each data lead 73) may correspond to a plurality of data lines 12, thereby reducing the number of data drive lines 63 and the number of data leads 73 (and accordingly, the number of pads 8 and the number of chips), simplifying product structure and facilitating a narrow-bezel design of the display apparatus.

Referring to FIGS. 1 and 2, the multiplexing drive lines 64 also need to be connected to the pads 8 through the multiplexing leads 74 extending in the first direction 991, and the multiplexing leads 74 are also located between the first group of data leads 738 and the second group of data leads 739.

The multiplexing circuit A2 may include a plurality of multiplexing units 2 (MUX).

Figure 12:
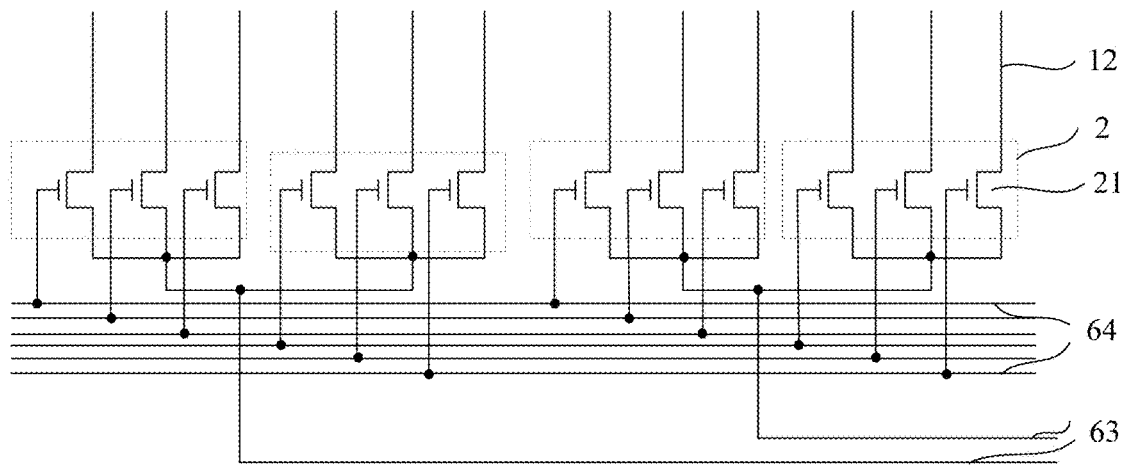
FIG. 12 is a circuit diagram of a multiplexing unit in a display substrate according to an embodiment of the present disclosure.
Figure 22:
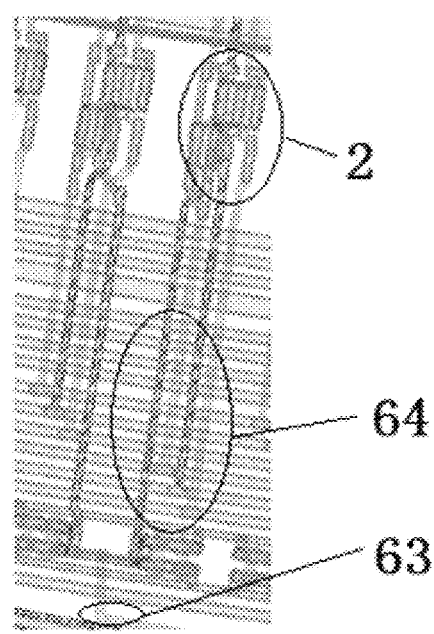
FIG. 22 is a structural design layout of a multiplexing unit in a display substrate according to an embodiment of the present disclosure.

Referring to FIGS. 12 and 22, in some implementations, each of the plurality of multiplexing units 2 includes m (at least 2) multiplexing transistors 21, in which a gate of each multiplexing transistor 21 is electrically connected to one of the plurality of multiplexing drive lines 64, a first electrode of each multiplexing transistor 21 is electrically connected to one of the plurality of data lines 12, and second electrodes of the m multiplexing transistor 21 are all electrically connected to one of the plurality of data drive lines 63.

As can be seen, when an turn-on signal is provided for any one of the gate lines 13 during display, the turn-on signal may be provided for each multiplexing drive line 64 in a time-division manner to turn on the multiplexing transistors 21 in each multiplexing unit 2 in a time-division manner; and when any multiplexing transistor 21 is turned on, a data signal required for a data line 12 electrically connected to the multiplexing transistor 21 is provided through a corresponding data drive line 63 to write the data signal into a corresponding sub-pixel 1.

Illustratively, referring to FIGS. 12 and 22, m is 3, i.e., each multiplexing unit 2 may control three data lines 12 (one-to-three).

Apparently, in this manner, the number of data lines 12 may be equal to "m×the number of multiplexing units 2"; while the number of multiplexing drive lines 64 should not be less than m. For example, referring to FIGS. 12 and 22, when every two multiplexing units 2 are electrically connected to one of the data drive line 63, the number of multiplexing drive lines 64 may be m (e.g., 3).

Specifically, structures of the multiplexing units 2 may be distributed in the respective layers in various manners.

For example, an active layer of each multiplexing transistor 21 may be disposed in the same layer as, and spaced apart from, the first active layer 111, and covered by the gate insulation layer 190. The gate of each multiplexing transistor 21 may be disposed in the same layer as the first gate 112, which layer is further provided with a structure (or a part of the data lines 12) configured to electrically connect first electrodes of a part of the multiplexing transistors 21 to the corresponding data lines 12. The first electrode and the second electrode of each multiplexing transistor 21 may be disposed in the same layer as the first source 113 and the first drain 114, and second electrodes of the multiplexing transistors 21 in a same multiplexing unit 2 are integrally connected at one end. The electrical connection of corresponding structures can be achieved through a through in the second insulation layer 192.

In some implementations, the plurality of gate drive lines 61, the plurality of multiplexing drive lines 64, and the plurality of data drive lines 63 are located on a side of the gate driver circuit A41 and the multiplexing circuit A2 away from the display region 91.

In some implementations, the plurality of multiplexing drive lines 64 are located on a side of the plurality of gate drive lines 61 away from the display region 91; and the plurality of data drive lines 63 are located on a side of the plurality of multiplexing drive lines 64 away from the display region 91.

Figure 19:
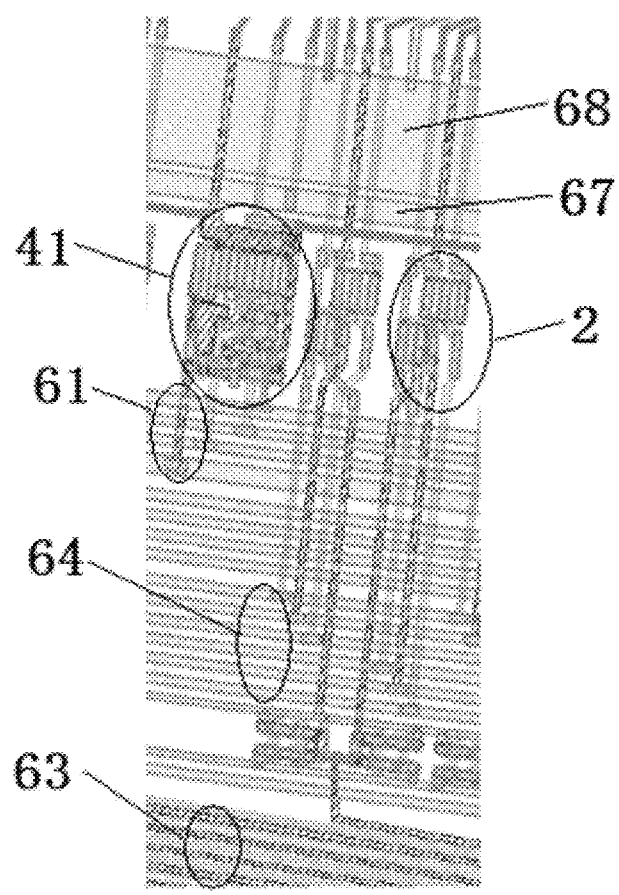
FIG. 19 shows a partially enlarged structural design layout at a location in a peripheral region of a display substrate according to an embodiment of the present disclosure.
Figure 20:
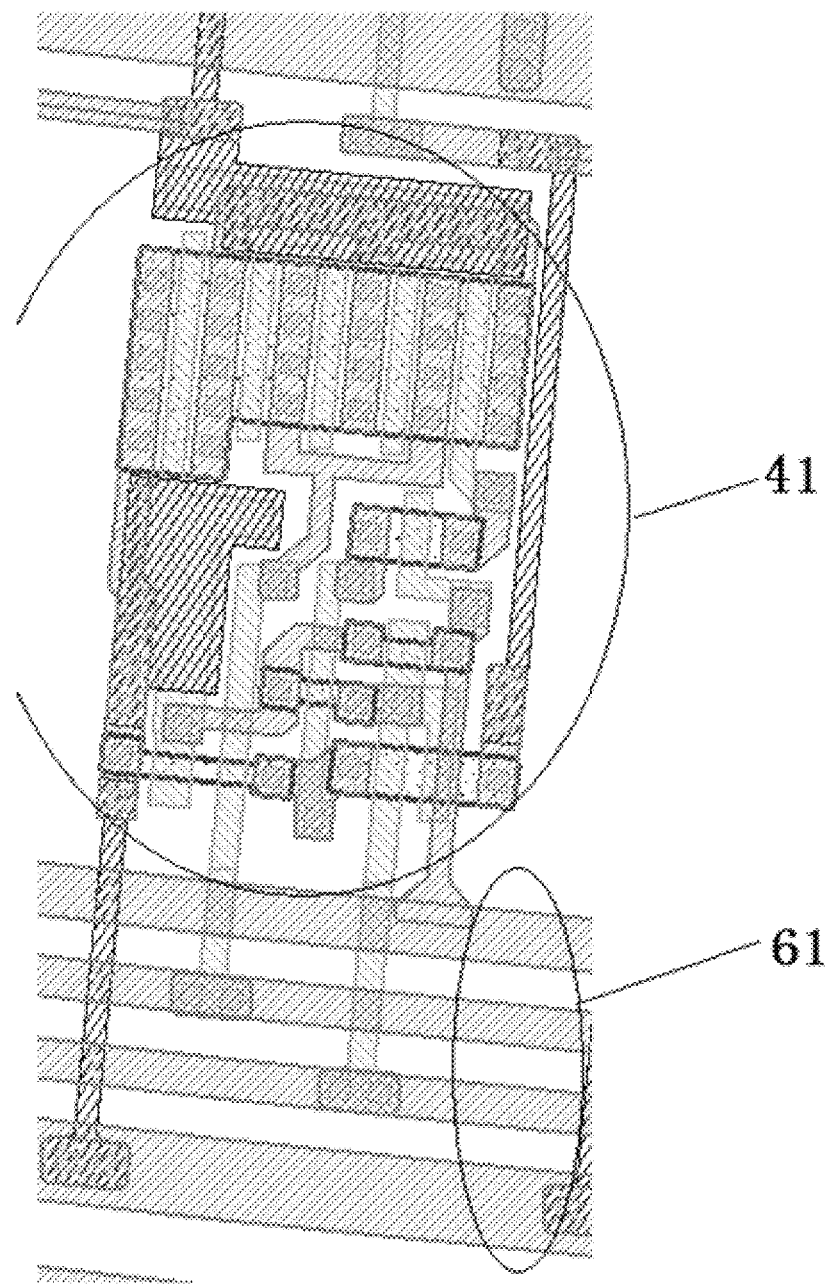
FIG. 20 is a structural design layout of a gate shift register in a display substrate according to an embodiment of the present disclosure.
Figure 21:
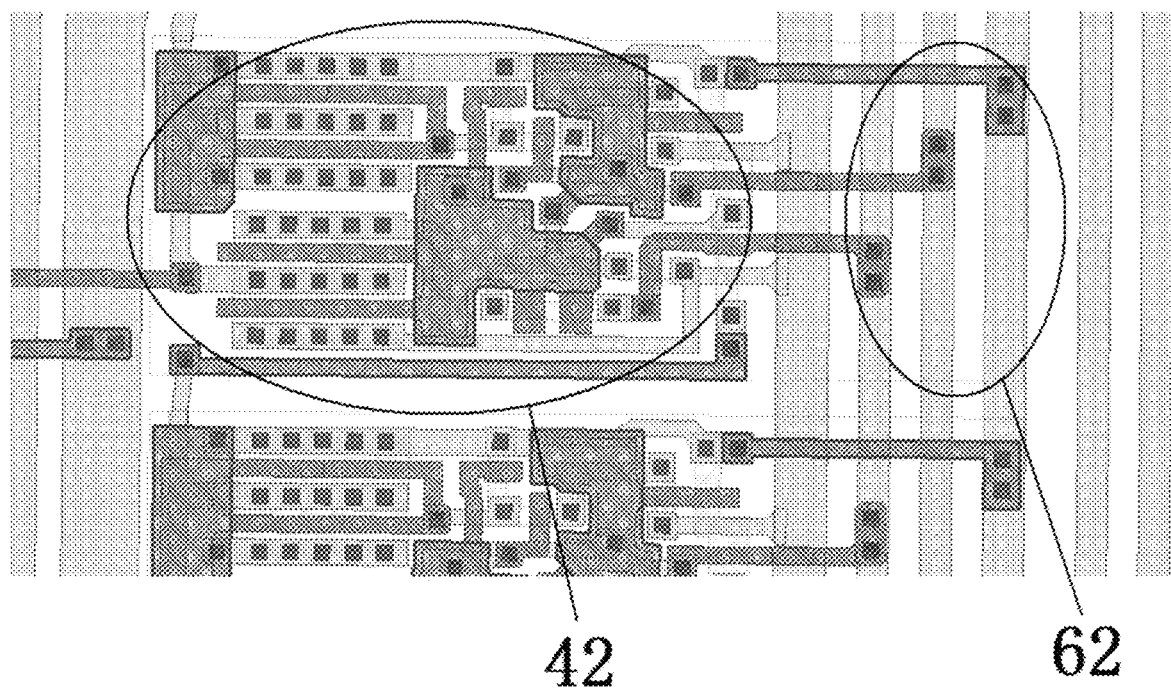
FIG. 21 is a structural design layout of a control shift register in a display substrate according to an embodiment of the present disclosure.

Referring to FIG. 19, the gate drive lines 61, the multiplexing drive lines 64 and the data drive lines 63 may be disposed "outside" the gate driver circuit A41 (or further the control driver circuit A42) and the multiplexing circuit A2 so that these circuits are closer to the display region 91 and supply power to the data lines 12 and the gate lines 13 in the display region 91.

Further, among the above drive lines, the gate drive lines 61 (or further the control drive lines 62) may be "innermost", and since driving of the shift registers (the gate shift register, the control shift register) is more important, it is preferable that the corresponding lines for driving are as close to the shift registers as possible; while the data drive lines 63, having the largest number and a larger occupied area, may be disposed at an outermost side.

Specific positions of the units in the various driver circuits may be set as needed.

For example, referring to FIG. 19, in a lower left half of the peripheral region 92, the gate drive units 41 in the gate driver circuit A41 may be "mixed-arranged" with the multiplexing units 2 in the multiplexing circuit A2 along a circumferential direction of the peripheral region 92.

In a lower right half of the peripheral region 92, the control drive units 42 in the control driver circuit A42 may be "mixed-arranged" with the multiplexing units 2 in the multiplexing circuit A2 along the circumferential direction of the peripheral region 92.

In an upper left half of the peripheral region 92, the gate drive units 41 in the gate driver circuit A41 may be "mixed-arranged" with the test units 3 in a test circuit A3, which will be described later, along the circumferential direction of the peripheral region 92.

In an upper right half of the peripheral region 92, the control drive units 42 in the control driver circuit A42 may be "mixed-arranged" with the test units 3 in the test circuit A3, which will be described later, along the circumferential direction of the peripheral region 92.

Since a electrostatic discharge circuit A5, which will be described later, has a smaller number of electrostatic discharge units 5, the electrostatic discharge units 5 may be disposed merely in gaps of some other structures.

Specific positions of other drive lines may be set as needed.

For example, referring to FIG. 18, the first power drive line 68 and the initialization drive line 67, which will be described later, may be located "inside" the gate drive units 41, the multiplexing units 2, and the like (the first power drive line 68 may be innermost, and the initialization drive line 67 may be outer).

For example, a second power drive line 69, which will be described later, is located "outside" the data drive lines 63, and thus "outside" the gate drive units 41, the multiplexing units 2, and the like.

For example, referring to FIG. 18, test drive lines 65, which will be described later, may be arranged between different gate drive lines 61 (or control drive lines 62) with the gate drive lines 61 (and further the control drive lines 62) and the multiplexing drive lines 64. The specific arrangement order may vary (the same type of drive lines are not necessarily arranged continuously together).

In some implementations, the display substrate further includes:

a test circuit A3 located in the peripheral region 92 and electrically connected to the plurality of data lines 12;

a plurality of test drive lines 65 located in the peripheral region 92 and at least partially surrounding the display region 91, where the plurality of test drive lines 65 are electrically connected to the test circuit A3; and a plurality of test leads 75 located in the peripheral region 92 and extending in the first direction 991, where the plurality of test leads 75 are electrically connected to the plurality of test drive lines 65 and the plurality of pads 8; and the plurality of test leads 75 are located between the first group of data leads 738 and the second group of data leads 739.

Referring to FIG. 1, the display substrate further includes the test circuit A3 that is also connected to each data line 12, so that each sub-pixel 1 can be tested under the control of the plurality of test drive lines 65, such as a lighting test is performed on the display substrate before delivery.

Referring to FIGS. 1 and 2, the test drive lines 65 also need to be connected to the corresponding pads 8 through the test leads 75 extending in the first direction 991, and the test leads 75 are also located between the first group of data leads 738 and the second group of data leads 739.

In some implementations, the plurality of test drive lines 65 include a test data signal line 651 and a test control signal line 652.

The test circuit A3 may include a plurality of test units (CT) 3.

Figure 13:
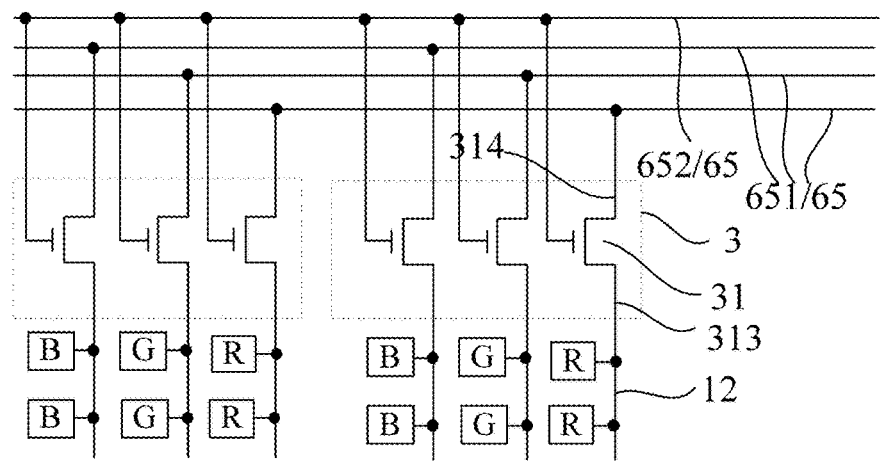
FIG. 13 is a circuit diagram of a test unit in a display substrate according to an embodiment of the present disclosure.
Figure 23:
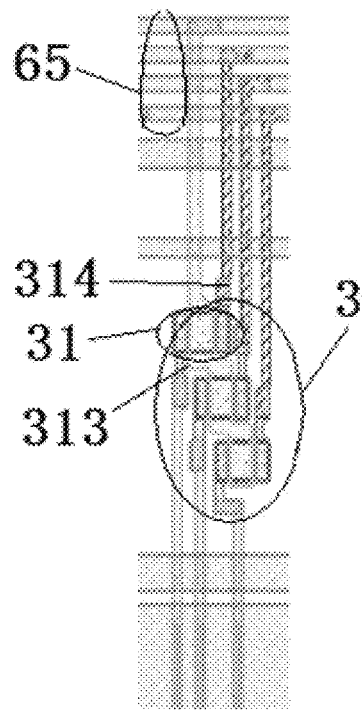
FIG. 23 is a structural design layout of a test unit in a display substrate according to an embodiment of the present disclosure.

Referring to FIGS. 13 and 23, each test unit 3 is electrically connected to at least one test data signal line 651, at least one test control signal line 652, and at least one of the plurality of data lines 12, and is configured to provide, according to a signal supplied from the at least one test control signal line 652, a signal supplied from the at least one test data signal line 651 to the at least one data line 12.

Referring to FIG. 13, as an implementation of the embodiment of the present disclosure, the at least one test data signal line 651 includes a total number of n (at least 2, for example, 3) test data signal lines 651, the at least one test control signal line 652 includes a total number of one test control signal line 652, where n is an integer greater than or equal to 2; and
  at least one of the plurality of test units 3 includes n test transistors 31, in which gates 311 of the n test transistors 31 are electrically connected to one test control signal line 652, a first electrode 313 of each test transistor 31 is electrically connected to one of the plurality of data lines 12, and a second electrode 314 of each test transistor 31 is electrically connected to one of the n test data signal lines 651.

As an implementation of the embodiment of the present disclosure, n test data signal lines 651 are provided, while only one test control signal line 652 is provided. Each test unit 3 includes n test transistors 31, where gates 311 of then test transistors 31 are electrically connected to test control signal line 652, and first electrodes 313 (e.g., drains) of the n test transistors 31 are electrically connected to different data lines 12, respectively; and second electrodes 314 (e.g., sources) of the n test transistors 31 are electrically connected to the n test data signal lines 651, respectively (i.e., second electrodes of different test transistors 31 are electrically connected to different test data signal lines 651).

As can be seen, the test control signal line 652 may be used to control whether to turn on the test transistors 31 in each test unit 3, and control to write signals of the test data signal lines 651 into different data lines 12, i.e., control whether to perform a test. To perform a test, a turn-on signal may be supplied to the test control signal line 652, and a desired signal may be supplied to each of the n test data signal lines 651 so that each data line 12 obtains the desired signal to perform detection.

Thereby, in some implementations, the number of data lines 12 may be equal to n×the number of test units 3.

In some implementations, n is 3.

In some implementations, each data line 12 is electrically connected to sub-pixels 1 of a same color, such as a column of sub-pixels 1 of a same color. For example, columns of red, green, and blue sub-pixels may be arranged in the second direction 992. In FIG. 13, each red sub-pixel, each green sub-pixel, and each blue sub-pixel are respectively denoted by R, G, and B.

Therefore, during testing, a same signal may be provided for the data lines 12 corresponding to the sub-pixels 1 of a same color so that the sub-pixels 1 display in a same manner (such as lighting or not lighting). Therefore, it is possible to determine whether there is a defect sub-pixel 1 according to a color of the display screen, and further locate the defect sub-pixel 1.

Apparently, the color arrangement of the sub-pixels 1 and the specific form of the test units 3 are not limited thereto.

In some implementations, the display substrate further includes:
  a multiplexing circuit A2 located in the peripheral region 92 and electrically connected to the plurality of data lines 12, where
  the test circuit A3 and the multiplexing circuit A2 are located on two opposite sides of the display region 91 along the first direction 991; and
  the plurality of pads 8 are located on a side of the multiplexing circuit A2 away from the display region 91.

Referring to FIG. 1, since the test circuit A3 and the multiplexing circuit A2 are both connected to the data lines 12, and the data lines 12 extend in the first direction 991, the test circuit A3 (a plurality of test units 3) and the multiplexing circuit A2 (a plurality of multiplexing units 2) may be disposed opposite to each other along the first direction 991 for easy wiring. Since the multiplexing circuit A2 requires the largest number of data drive lines 63, the pads 8 may be disposed on a side where the multiplexing circuit A2 is located, so that the data drive lines 63 can be connected to the multiplexing circuit A2 "in the near" without bypassing half turn before connecting.

In some implementations, the display substrate further includes:
  an electrostatic discharge circuit A5 in the peripheral region 92;
  an electrostatic discharge drive line 66 located in the peripheral region 92 and at least partially surrounding the display region 91, where the electrostatic discharge drive line 66 is electrically connected to the electrostatic discharge circuit A5; and
  an electrostatic discharge lead located in the peripheral region 92 and extending in the first direction 991, where the electrostatic discharge lead is electrically connected to the electrostatic discharge drive line 66 and the pads 8; and the electrostatic discharge lead is located between the first group of data leads 738 and the second group of data leads 739.

Referring to FIG. 1, in some implementations, the display substrate further includes the electrostatic discharge circuit A5 configured to discharge static electricity accumulated in other lines (such as the gate drive lines 61, the control drive lines 62, the multiplexing drive lines 64, the test drive lines 65, etc.) to avoid electrostatic breakdown and other disadvantages caused by excessive accumulation of static electricity in the lines. The electrostatic discharge circuit A5 may be operated under the control of the electrostatic discharge drive line 66 which is connected to an electrostatic discharge lead, and the electrostatic discharge lead is also located between the first group of data leads 738 and the second group of data leads 739.

Specifically, the electrostatic discharge circuit A5 may include electrostatic discharge units (ESD) 5. Each electrostatic discharge unit 5 is configured to discharge static electricity in a line to be protected (such as a gate drive line 61, a control drive line 62, a multiplexing drive line 64, a test drive line 65, etc.) to the electrostatic discharge drive line 66.

Figure 14:
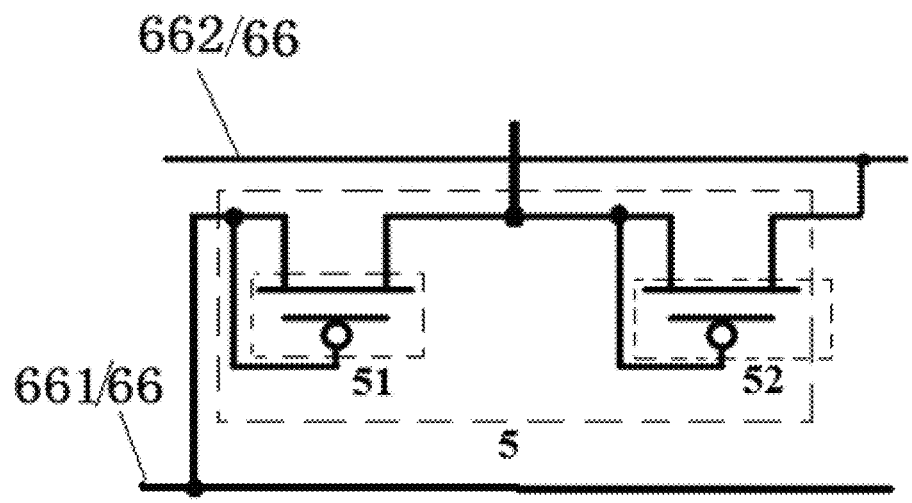
FIG. 14 is a circuit diagram of an electrostatic discharge unit in a display substrate according to an embodiment of the present disclosure.
Figure 24:
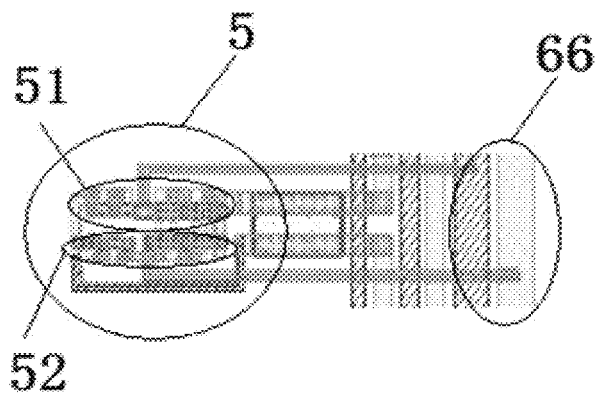
FIG. 24 is a structural design layout of an electrostatic discharge unit in a display substrate according to an embodiment of the present disclosure.

Referring to FIGS. 14 and 24, in some implementations, the electrostatic discharge drive line 66 may include an electrostatic high-level line 661 and an electrostatic low-level line 662. Each electrostatic discharge unit 5 includes a first discharge transistor 51 and a second discharge transistor 52. The first discharge transistor 51 has a gate and a first electrode connected to the electrostatic high-level line 661, and a second electrode connected to a line (the upper vertical line in FIG. 14) to be protected by the electrostatic discharge unit 5. The second discharge transistor 52 has a gate and a first electrode connected the line to be protected by the electrostatic discharge unit 5, and a second electrode connected to the electrostatic low-level line 662.

A high-level signal VGH and a low-level signal VGL are respectively and continuously loaded to the electrostatic high-level line 661 and the electrostatic low-level line 662.

Referring to FIG. 14, the electrostatic discharge unit 5 includes the first discharge transistor 51 and the second discharge transistor 52, and each discharge transistor has the first electrode connected to its own gate, forming an equivalent "diode". Thus, when a momentary high voltage (e.g., 100V) occurs in the line to be protected by the electrostatic discharge unit 5 due to accumulation of positive charges, the "diode" of the first discharge transistor 51 is turned on to discharge the positive charges in the signal line; and when a momentary low voltage (e.g., −100V) occurs in the signal line due to accumulation of negative charges, the "diode" of the second discharge transistor 52 is turned on to discharge the negative charges in the signal line.

In some implementations, the display substrate further includes:
an initialization drive line 67 located in the peripheral region 92 and at least partially surrounding the display region 91, where the initialization drive line 67 is electrically connected to the plurality of sub-pixels 1;
an initialization lead 77 located in the peripheral region 92 and extending in the first direction 991, where the initialization lead 77 is electrically connected to the initialization drive line 67 and the pad 8; and the initialization lead 77 is located between the first group of data leads 738 and the second group of data leads 739.

Referring to FIGS. 1, 2, 17 and 18, as mentioned above, in order to provide an initialization signal for an initialization signal terminal Vinit of each sub-pixel 1 in the display region 91, the peripheral region 92 may be further provided with the initialization drive line 67 connected to an initialization lead 77, and the initialization lead 77 is also located between the first group of data leads 738 and the second group of data leads 739.

In some implementations, the display substrate further includes:
a first power drive line 68 located in the peripheral region 92 and at least partially surrounding the display region 91, where the first power drive line 68 is electrically connected to the plurality of sub-pixels 1;
a first power lead 78 located in the peripheral region 92 and extending in the first direction 991, where the first power lead 78 is electrically connected to the first power drive line 68 and the pad 8; and the first power lead 78 is located between the first group of data leads 738 and the second group of data leads 739;
a second power drive line 69 located in the peripheral region 92 and at least partially surrounding the display region 91, where the second power drive line 69 is electrically connected to the plurality of sub-pixels 1;
a second power lead 79 located in the peripheral region 92 and extending in the first direction 991, where the second power lead 79 is electrically connected to the second power drive line 69 and the pad 8; and the second power lead 79 is located on a side of the first group of data leads 738 away from the second group of data leads 739, or located on a side of the second group of data leads 739 away from the first group of data leads 738.

Figure 17:
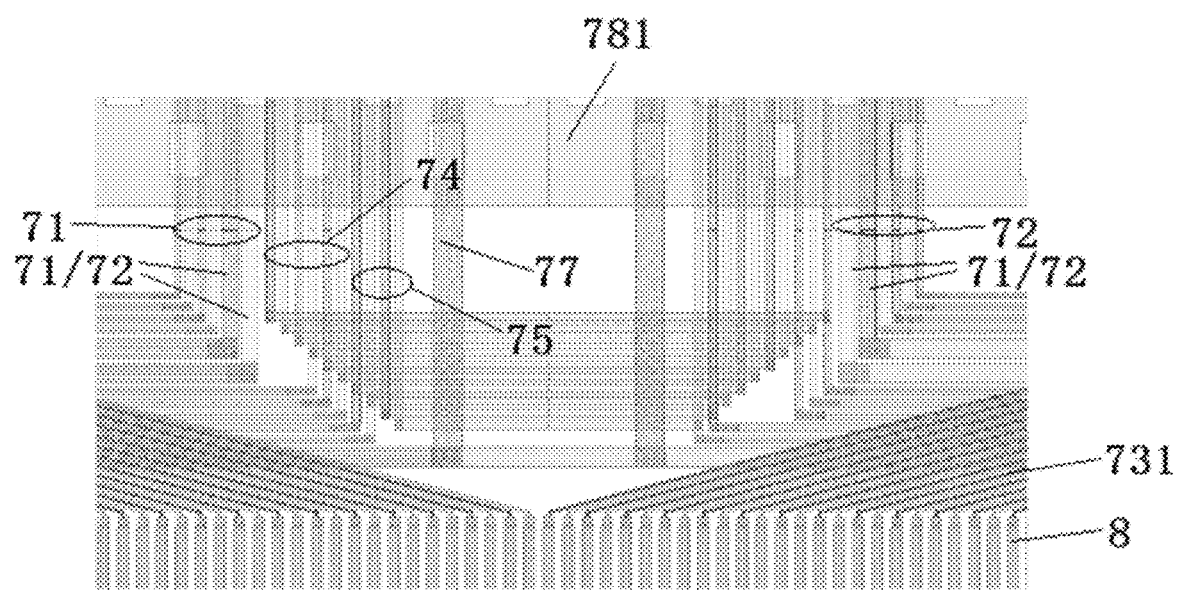
FIG. 17 shows a partially enlarged structural design layout at location C of the display substrate of FIG. 4.

Referring to FIGS. 1, 2, and 17, as mentioned above, in order to provide the first power signal terminal VDD and the second power signal terminal VSS of each sub-pixel 1 of the display region 91 with a first power signal (corresponding to an anode) and a second power signal (corresponding to a cathode), the peripheral region 92 may be further provided therein with the first power drive line 68 and the second power drive line 69 which are respectively connected to the pads 8 through the first power lead 78 and the second power lead 79 extending in the first direction 991.

The first power lead 78 is also located between the first group of data leads 738 and the second group of data leads 739; while on the contrary, the second power lead 79 is located "outside" the first group of data leads 738 and the second group of data leads 739.

The specific positional relationship of the various leads may vary as long as the above positional requirements are satisfied.

For example, referring to FIGS. 17 and 18, among the other leads between the first group of data leads 738 and the second group of data leads 739, the first power lead 78 is disposed at the center, the initialization leads 77 are disposed at both sides of the first power lead 78, further outer on both sides of the first power lead 78 are the test leads 75 and the multiplexing leads 74, and still further outer on both sides of the first power lead 78 are the gate lead 71 and the control lead 72 (the case where the gate lead 71 is at a left side of the control lead 72 is taken as an example in the figures).

Referring to FIGS. 2, 17, and 18, the test drive line 65, the multiplexing drive line 64, the high-level signal line 615, the low-level signal line 616, and the like may respectively form a closed loop. Therefore, each of the above lines may correspond to two leads connected from both sides. In contrast, the gate drive lines 61 and the control drive lines 62 each correspond to only a "half turn" of the peripheral region 92, and other leads (except for the high-level signal line 615 and the low-level signal line 616) corresponding these lines may individually enter from one side.

In some implementations, the plurality of pads 8 are located in an access region 921 and arranged along the second direction 992; in the first direction 991, the access region 921 is located on a side of the display region 91;
the plurality of gate leads 71 and the plurality of data leads 73 are located in a lead-out region 922; and in the first direction 991, the lead-out region 922 is located between the access region 921 and the display region 91; and
in the second direction 992, the plurality of gate leads 71 are located between the first group of data leads 738 and the second group of data leads 739.

Referring to FIG. 2, the plurality of pads 8 may be arranged in a row along the second direction 992, and located in the access region 921 at a side of the display region 91 in the first direction 991. Between the access region 921 and the display region 91 is the lead-out region 922 for providing the above leads.

Thus, referring to FIG. 2, the leads extend in the lead-out region 922 along the first direction 991, while different leads should be arranged along the second direction 992. That is, other majority leads (except for the second power lead 79) should be located between the first group of data leads 738 and the second group of data leads 739 in the second direction 992, or in other words, the first group of data leads 738 and the second group of data leads 739 are located on two side of the other majority leads respectively in the second direction 992.

In some implementations, in the second direction 992, the plurality of the pads 8 electrically connected to the plurality of gate leads 71 are located between a plurality of the pads 8 electrically connected to the first group of data leads 738 and a plurality of the pads 8 electrically connected to the second group of data leads 739.

Figure 3:
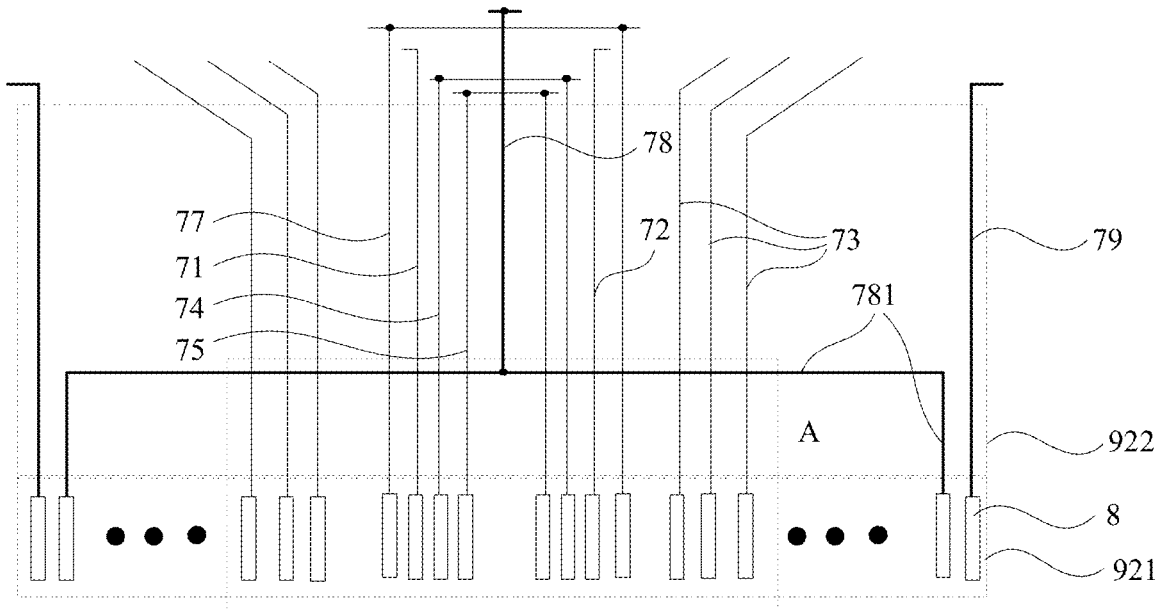
FIG. 3 is a schematic partial structural view of an access region and a lead-out region in a display substrate according to an embodiment of the present disclosure.
Figure 4:
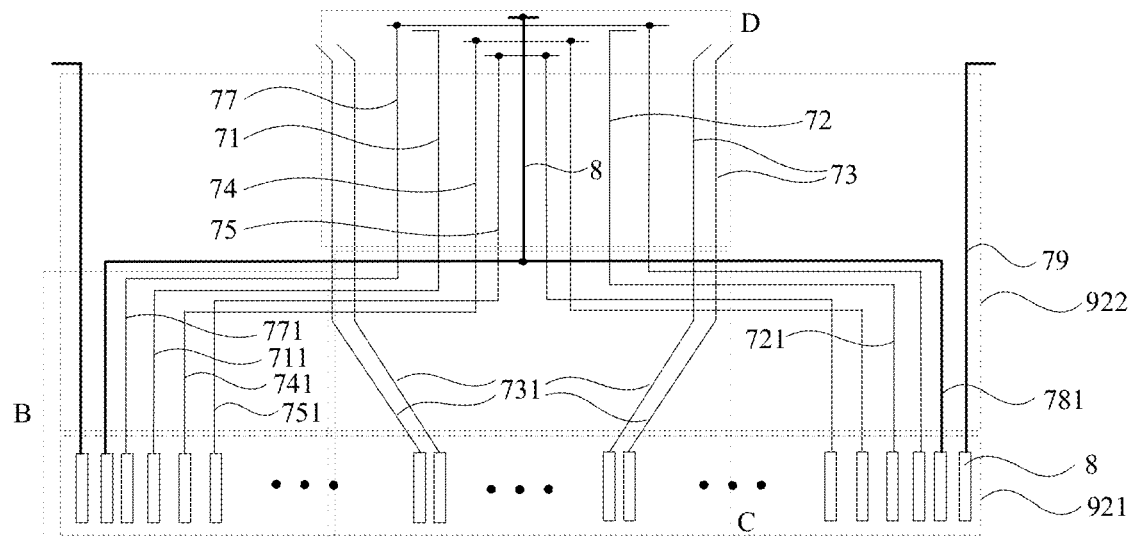
FIG. 4 is a schematic partial structural view of an access region and a lead-out region in a display substrate according to another embodiment of the present disclosure.
Figure 15:
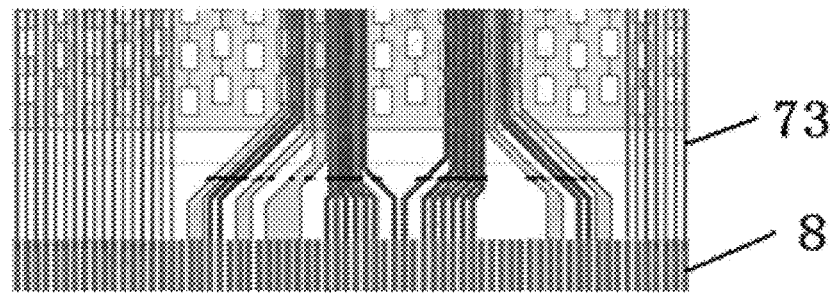
FIG. 15 shows a partially enlarged structural design layout at location A of the display substrate of FIG. 3.
Figure 16:
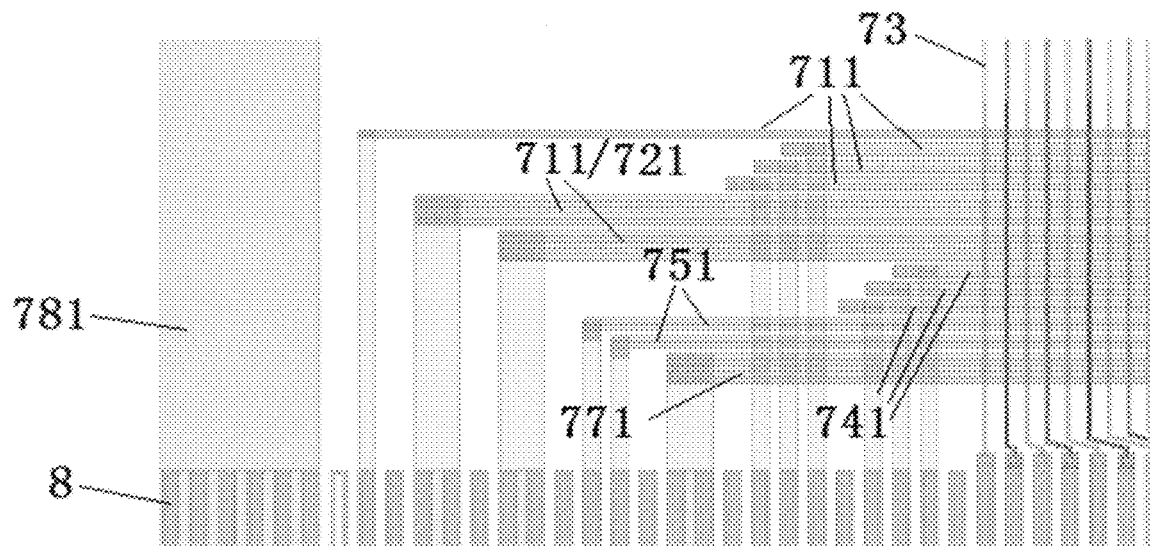
FIG. 16 shows a partially enlarged structural design layout at location B of the display substrate of FIG. 4.

Referring to FIGS. 3 and 15, as an implementation of the embodiment of the present disclosure, the pads 8 corresponding to the data leads 73 should also be divided into two groups, and located outside the pads 8 corresponding to the other majority leads (except for the first power lead 78 and the second power lead 79).

Thus, most of pads 8 can be directly connected to the corresponding leads.

In some implementations, the display substrate further includes:
- a plurality of control lines 14 located in at least the display region 91 and extending in the second direction 992, where the plurality of control lines 14 are electrically connected to the plurality of sub-pixels 1;
- a control driver circuit A42 located in the peripheral region 92 and electrically connected to the plurality of control lines 14;
- a plurality of control drive lines 62 located in the peripheral region 92 and at least partially surrounding the display region 91, where the plurality of control drive lines 62 are electrically connected to the control driver circuit A42; and
- a plurality of control leads 72 located in the peripheral region 92 and extending in the first direction 991, where the plurality of control leads 72 are electrically connected to the plurality of control drive lines 62 and a plurality of pads 8; and the plurality of control leads 72 are located between the first group of data leads 738 and the second group of data leads 739.

In the second direction 992, the plurality of the pads 8 electrically connected to the plurality of data leads 73 are located between a plurality of the pads 8 electrically connected to the plurality of gate leads 71 and a plurality of the pads 8 electrically connected to the plurality of control leads 72.

At least part of the data leads 73 are electrically connected to a plurality of pads 8 through a plurality of data auxiliary leads 731, the plurality of gate leads 71 are electrically connected to the plurality of pads 8 through a plurality of gate auxiliary leads 711, and the plurality of control leads 72 are electrically connected to the plurality of pads 8 through a plurality of control auxiliary leads 721.

Referring to FIGS. 4, 16, 17, and 18, as another implementation of the embodiment of the present disclosure, it is also possible that the gate leads 71, the control leads 72 (or further the multiplexing leads 74, the test leads 75, the initialization leads 77, and the first power lead 78) are still located between the first group of data leads 738 and the second group of data leads 739 in the second direction 992; but the pads 8 corresponding to the data leads 73 are located between the pads 8 corresponding to the gate leads 71, the control leads 72 (or further the multiplexing leads 74, the test leads 75, the initialization leads 77, and the first power lead 78) in the second direction 992.

Therefore, the data leads 73 needs to be connected to the pads 8 through the data auxiliary leads 731. That is, the data auxiliary leads 731 extend at least partially in the second direction 992, so that in the second direction 992, signals from the pads 8 are led into the data leads 73 from middle to two sides.

Similarly, the gate leads 71 and the control leads 72 need to be connected to the corresponding pads 8 through the gate auxiliary leads 711 and the control auxiliary leads 721, respectively (the multiplexing leads 74, the test leads 75, the initialization leads 77, and the first power lead 78 also need to be connected to the corresponding pads 8 through multiplexing auxiliary leads 741, test auxiliary leads 751, initialization auxiliary leads 771, and first power auxiliary leads 781, respectively).

In some implementations, the display substrate further includes:
- a first power drive line 68 located in the peripheral region 92 and at least partially surrounding the display region 91, where the first power drive line 68 is electrically connected to the plurality of sub-pixels 1;
- a first power lead 78 located in the peripheral region 92 and extending in the first direction 991, where the first power lead 78 is electrically connected to the first power drive line 68 and the pads 8; and the first power lead 78 is located between the first group of data leads 738 and the second group of data leads 739;
- a second power drive line 69 located in the peripheral region 92 and at least partially surrounding the display region 91, where the second power drive line 69 is electrically connected to the plurality of sub-pixels 1;
- a second power lead 79 located on a side of the first group of data leads 738 away from the second group of data leads 739, or located on a side of the second group of data leads 739 away from the first group of data leads 738.

In the second direction 992, the pads 8 electrically connected to the first power lead 78 are located on a side of the pads 8 electrically connected to the first group of data leads 738 away from the pads 8 electrically connected to the second group of data leads 739, or located on a side of the pads 8 electrically connected to the second group of data leads 739 away from the pads 8 electrically connected to the first group of data leads 738.

In the second direction 992, the pads 8 electrically connected to the second power lead 79 are located on a side of the pads 8 electrically connected to the first group of data leads 738 away from the pads 8 electrically connected to the second group of data leads 739, or located on a side of the pads 8 electrically connected to the second group of data leads 739 away from the pads 8 electrically connected to the first group of data leads 738.

The first power lead 78 is electrically connected to the pads 8 through the first power auxiliary lead 781.

Referring to FIGS. 2, 4, 5, and 16, in the second direction 992, the pads 8 corresponding to the first power lead 78 and the second power lead 79 are typically located on two sides of other pads 8, or in other words, each of the other pads 8 are located between two pads 8 connected to the first power lead 78 and also between two pads 8 connected to the second power lead 79.

As mentioned above, since the first power lead 78 is located between the first group of data leads 738 and the second group of data leads 739, the first power lead 78 needs to be connected to the corresponding pads 8 through the first power auxiliary lead 781 extending at least partially in the second direction 992.

Further, since the second power lead 79 is located outside the first group of data leads 738 and the second group of data leads 739, the second power lead 79 may be directly connected to the corresponding pads 8.

In a second aspect, an embodiment of the present disclosure provides a display apparatus, including:

any one of the display substrates as described above.

The above display substrate may be combined with other devices (e.g., an assembling cover plate, a flexible circuit board, a driver chip, a power supply module, etc.) to form a display apparatus having a display function.

In some implementations, the display apparatus is a wearable display apparatus.

Specifically, the display apparatus is particularly suitable as a wearable display apparatus wearable on a human body, such as a smart watch wearable on a wrist of a person, or the like.

Apparently, the wearable display apparatus may further include a watch strap or other means to be worn on a human body.

Apparently, the display apparatus is not limited to a wearable display apparatus, and may also be an electronic paper, a mobile phone, a tablet, a television, a monitor, a laptop, a digital album, a navigator or any other product or component having a display function.

The present disclosure has disclosed example embodiments, and although specific terms are employed, they are used and should be interpreted in a generic and descriptive sense only and not for purposes of limitation. In some instances, features, characteristics and/or elements described in connection with a particular embodiment may be used alone or in combination with features, characteristics and/or elements described in connection with other embodiments, unless expressly stated otherwise, as would be apparent to one skilled in the art. It will, therefore, be understood by those skilled in the art that various changes in form and details may be made therein without departing from the scope of the present disclosure as set forth in the appended claims.

What is claimed is:

1. A display substrate, comprising:
a base comprising a display region and a peripheral region surrounding the display region;
a plurality of sub-pixels in the display region;
a plurality of data lines located in at least the display region and extending in a first direction, wherein the plurality of data lines are electrically connected to the plurality of sub-pixels;
a plurality of gate lines located in at least the display region and extending in a second direction, wherein the plurality of gate lines are electrically connected to the plurality of sub-pixels, and the first direction intersects with the second direction;
a plurality of pads in the peripheral region;
a plurality of data leads located in the peripheral region and electrically connected to the plurality of data lines and a plurality of the pads, wherein the plurality of data leads comprise a first group of data leads and a second group of data leads;
a gate driver circuit located in the peripheral region and electrically connected to the plurality of gate lines;
a plurality of gate drive lines located in the peripheral region and at least partially surrounding the display region, wherein the plurality of gate drive lines are electrically connected to the gate driver circuit;
a plurality of gate leads located in the peripheral region and extending in the first direction, wherein the plurality of gate leads are electrically connected to the plurality of gate drive lines and a plurality of the pads; and the plurality of gate leads are located between the first group of data leads and the second group of data leads;
a plurality of control lines located in at least the display region and extending in the second direction, wherein the plurality of control lines are electrically connected to the plurality of sub-pixels;
a control driver circuit located in the peripheral region and electrically connected to the plurality of control lines;
a plurality of control drive lines located in the peripheral region and at least partially surrounding the display region, wherein the plurality of control drive lines are electrically connected to the control driver circuit; and
a plurality of control leads located in the peripheral region and extending in the first direction, wherein the plurality of control leads are electrically connected to the plurality of control drive lines and a plurality of the pads; and the plurality of control leads are located between the first group of data leads and the second group of data leads.

2. The display substrate according to claim 1, wherein the plurality of gate drive lines comprise a gate start signal line, a first gate clock signal line, a second gate clock signal line, a gate drive test line, a high-level signal line, and a low-level signal line.

3. The display substrate according to claim 1, wherein the plurality of control drive lines comprise a control start signal line, a first control clock signal line, a second control clock signal line, a control drive test line, a high-level signal line, and a low-level signal line.

4. The display substrate according to claim 1, wherein the gate driver circuit and the control driver circuit are located on two opposite sides of the display region along the second direction.

5. A display substrate, comprising:
a base comprising a display region and a peripheral region surrounding the display region;
a plurality of sub-pixels in the display region;
a plurality of data lines located in at least the display region and extending in a first direction, wherein the plurality of data lines are electrically connected to the plurality of sub-pixels;
a plurality of gate lines located in at least the display region and extending in a second direction, wherein the plurality of gate lines are electrically connected to the plurality of sub-pixels, and the first direction intersects with the second direction;
a plurality of pads in the peripheral region;
a plurality of data leads located in the peripheral region and electrically connected to the plurality of data lines and a plurality of the pads, wherein the plurality of data leads comprise a first group of data leads and a second group of data leads;
a gate driver circuit located in the peripheral region and electrically connected to the plurality of gate lines;
a plurality of gate drive lines located in the peripheral region and at least partially surrounding the display region, wherein the plurality of gate drive lines are electrically connected to the gate driver circuit;
a plurality of gate leads located in the peripheral region and extending in the first direction, wherein the plurality of gate leads are electrically connected to the plurality of gate drive lines and a plurality of the pads; and the plurality of gate leads are located between the first group of data leads and the second group of data leads;

a multiplexing circuit located in the peripheral region and electrically connected to the plurality of data lines;

a plurality of data drive lines located in the peripheral region and at least partially surrounding the display region, wherein the multiplexing circuit is electrically connected to the plurality of data drive lines and the plurality of data leads;

a plurality of multiplexing drive lines located in the peripheral region and at least partially surrounding the display region, wherein the plurality of multiplexing drive lines are electrically connected to the multiplexing circuit; and a plurality of multiplexing leads located in the peripheral region and extending in the first direction, wherein the plurality of multiplexing leads are electrically connected to the plurality of multiplexing drive lines and a plurality of the pads; and the plurality of multiplexing leads are located between the first group of data leads and the second group of data leads.

6. The display substrate according to claim 5, wherein the plurality of gate drive lines, the plurality of multiplexing drive lines and the plurality of data drive lines are located on a side of the gate driver circuit and the multiplexing circuit away from the display region.

7. The display substrate according to claim 6, wherein the plurality of multiplexing drive lines are located on a side of the plurality of gate drive lines away from the display region; and the plurality of data drive lines are located on a side of the plurality of multiplexing drive lines away from the display region.

8. A display substrate, comprising:

a base comprising a display region and a peripheral region surrounding the display region;

a plurality of sub-pixels in the display region;

a plurality of data lines located in at least the display region and extending in a first direction, wherein the plurality of data lines are electrically connected to the plurality of sub-pixels;

a plurality of gate lines located in at least the display region and extending in a second direction, wherein the plurality of gate lines are electrically connected to the plurality of sub-pixels, and the first direction intersects with the second direction;

a plurality of pads in the peripheral region;

a plurality of data leads located in the peripheral region and electrically connected to the plurality of data lines and a plurality of the pads, wherein the plurality of data leads comprise a first group of data leads and a second group of data leads;

a gate driver circuit located in the peripheral region and electrically connected to the plurality of gate lines;

a plurality of gate drive lines located in the peripheral region and at least partially surrounding the display region, wherein the plurality of gate drive lines are electrically connected to the gate driver circuit;

a plurality of gate leads located in the peripheral region and extending in the first direction, wherein the plurality of gate leads are electrically connected to the plurality of gate drive lines and a plurality of the pads; and the plurality of gate leads are located between the first group of data leads and the second group of data leads;

a test circuit located in the peripheral region and electrically connected to the plurality of data lines;

a plurality of test drive lines located in the peripheral region and at least partially surrounding the display region, wherein the plurality of test drive lines are electrically connected to the test circuit; and a plurality of test leads located in the peripheral region and extending in the first direction, wherein the plurality of test leads are electrically connected to the plurality of test drive lines and a plurality of the pads; and the plurality of test leads are located between the first group of data leads and the second group of data leads.

9. The display substrate according to claim 8, wherein the plurality of test drive lines comprise a test data signal line and a test control signal line.

10. The display substrate according to claim 8, further comprising:

a multiplexing circuit located in the peripheral region and electrically connected to the plurality of data lines; wherein the test circuit and the multiplexing circuit are located on two opposite sides of the display region along the first direction; and the plurality of pads are located on a side of the multiplexing circuit away from the display region.

11. The display substrate according to claim 1, further comprising:

an electrostatic discharge circuit in the peripheral region;

an electrostatic discharge drive line located in the peripheral region and at least partially surrounding the display region, wherein the electrostatic discharge drive line is electrically connected to the electrostatic discharge circuit; and an electrostatic discharge lead located in the peripheral region and extending in the first direction, wherein the electrostatic discharge lead is electrically connected to the electrostatic discharge drive line and a pad; and the electrostatic discharge lead is located between the first group of data leads and the second group of data leads.

12. The display substrate according to claim 1, further comprising:

an initialization drive line located in the peripheral region and at least partially surrounding the display region, wherein the initialization drive line is electrically connected to the plurality of sub-pixels; and an initialization lead located in the peripheral region and extending in the first direction, wherein the initialization lead is electrically connected to the initialization drive line and pads; and the initialization lead is located between the first group of data leads and the second group of data leads.

13. The display substrate according to claim 1, further comprising:

a first power drive line located in the peripheral region and at least partially surrounding the display region, wherein the first power drive line is electrically connected to the plurality of sub-pixels;

a first power lead located in the peripheral region and extending in the first direction, wherein the first power lead is electrically connected to the first power drive line and pads; and the first power lead is located between the first group of data leads and the second group of data leads;

a second power drive line located in the peripheral region and at least partially surrounding the display region, wherein the second power drive line is electrically connected to the plurality of sub-pixels; and a second power lead located in the peripheral region and extending in the first direction, wherein the second power lead is electrically connected to the second power drive line and pads; and the second power lead is located on a side of the first group of data leads away from the second group of data leads, or located on a side of the second group of data leads away from the first group of data leads.

14. The display substrate according to claim 1, wherein the peripheral region comprises an access region and a lead-out region, in the first direction, the access region is located on a side of the display region, and the lead-out region is located between the access region and the display region; the plurality of pads are located in the access region and arranged along the second direction; the plurality of gate leads and the plurality of data leads are located in the lead-out region; and in the second direction, the plurality of gate leads are located between the first group of data leads and the second group of data leads.

15. The display substrate according to claim 14, wherein in the second direction, a plurality of the pads electrically connected to the plurality of gate leads are located between a plurality of the pads electrically connected to the first group of data leads and a plurality of the pads electrically connected to the second group of data leads.

16. The display substrate according to claim 14, wherein in the second direction, a plurality of the pads electrically connected to the plurality of data leads are located between a plurality of the pads electrically connected to the plurality of gate leads and a plurality of the pads electrically connected to the plurality of control leads.

17. The display substrate according to claim 14, further comprising:

a first power drive line located in the peripheral region and at least partially surrounding the display region, wherein the first power drive line is electrically connected to the plurality of sub-pixels;

a first power lead located in the peripheral region and extending in the first direction, wherein the first power lead is electrically connected to the first power drive line and pads; and the first power lead is located between the first group of data leads and the second group of data leads;

a second power drive line located in the peripheral region and at least partially surrounding the display region, wherein the second power drive line is electrically connected to the plurality of sub-pixels; and a second power lead located in the peripheral region and extending in the first direction, wherein the second power lead is electrically connected to the second power drive line and pads; and the second power lead is located on a side of the first group of data leads away from the second group of data leads, or located on a side of the second group of data leads away from the first group of data leads;

in the second direction, the pads electrically connected to the first power lead are located on a side of the pads electrically connected to the first group of data leads away from the pads electrically connected to the second group of data leads, or located on a side of the pads electrically connected to the second group of data leads away from the pads electrically connected to the first group of data leads; and in the second direction, the pads electrically connected to the second power lead are located on a side of the pads electrically connected to the first group of data leads away from the pads electrically connected to the second group of data leads, or located on a side of the pads electrically connected to the second group of data leads away from the pads electrically connected to the first group of data leads.

18. The display substrate according to claim 1, wherein the display region is substantially circular; and the display substrate is substantially circular.

19. A display apparatus, comprising: the display substrate according to claim 1.

\* \* \* \* \*